US012061780B2

(12) United States Patent
Rickard et al.

(10) Patent No.: US 12,061,780 B2
(45) Date of Patent: *Aug. 13, 2024

(54) INTERACTIVE GRAPHICAL USER INTERFACES FOR SIMULATED SYSTEMS

(71) Applicant: Palantir Technologies Inc., Denver, CO (US)

(72) Inventors: Jesse Rickard, New York, NY (US);
Timothy Slatcher, Golden, CO (US);
Thomas McArdle, London (GB);
Aravind Baratha Raj, London (GB);
David Fowler, New York, NY (US);
David Skiff, Iowa City, IA (US)

(73) Assignee: Palantir Technologies Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/067,505

(22) Filed: Dec. 16, 2022

(65) Prior Publication Data

US 2023/0125026 A1   Apr. 20, 2023

Related U.S. Application Data

(63) Continuation of application No. 17/171,927, filed on Feb. 9, 2021, now Pat. No. 11,567,639.

(Continued)

(51) Int. Cl.
*G06F 30/27* (2020.01)
*G06F 3/0484* (2022.01)
(Continued)

(52) U.S. Cl.
CPC .......... *G06F 3/0484* (2013.01); *G06F 16/289* (2019.01); *G06F 30/20* (2020.01)

(58) Field of Classification Search
CPC ...... G06F 3/0484; G06F 16/289; G06F 30/20; G06F 16/248; G06F 16/24578;
(Continued)

(56) References Cited

U.S. PATENT DOCUMENTS 7,051,036 B2   5/2006   Rosnow et al.
7,685,140 B2   3/2010   Jackson
(Continued)

FOREIGN PATENT DOCUMENTS

EP   3107014   12/2016
EP   3866024   8/2021
(Continued)

OTHER PUBLICATIONS

Rubiolo et al., "Knowledge Discovery Through Ontology Matching: An Approach Based on an Artificial Neural Network Model", Information Sciences, vol. 194, Jul. 1, 2012, pp. 107-119.

(Continued)

*Primary Examiner* — Thuy Dao
(74) *Attorney, Agent, or Firm* — Knobbe, Martens, Olson & Bear, LLP

(57) ABSTRACT

Systems, computer program products, and computer-implemented methods for visualizing and interacting with a plurality of models that collectively represent a real world system depicted in a graphical user interface (GUI). The system described herein may generate an interactive GUI with multiple modes and a plurality of panels associated with the plurality of models. These panels and modes lay the framework for how a user can properly visualize and analyze the models at a particular point in time or over a period of time. The systems, computer program products, and computer-implemented methods may thus, according to various embodiments, enable a plurality of models that (Continued)

collectively represent a real world system be interacted with and visualized by a graphical user interface.

17 Claims, 10 Drawing Sheets

Related U.S. Application Data

(60) Provisional application No. 62/976,558, filed on Feb. 14, 2020.

(51) Int. Cl.
  *G06F 9/44* (2018.01)
  *G06F 11/36* (2006.01)
  *G06F 16/28* (2019.01)
  *G06F 30/20* (2020.01)

(58) Field of Classification Search
  CPC .. G06F 18/2193; G06F 18/2321; G06F 16/26; G06F 3/0481; G06F 11/3065; G06F 11/32; G06F 11/321; G06F 11/22; G06F 30/33; G06N 5/022; G06N 20/00; G06T 11/206
  See application file for complete search history.

(56) References Cited

U.S. PATENT DOCUMENTS

| | | | |
|---|---|---|---|
| 7,788,631 | B2 | 8/2010 | Sieron et al. |
| 8,225,223 | B2* | 7/2012 | Becerra, Jr. ........... G06F 3/0481 715/764 |
| 8,498,985 | B2 | 7/2013 | Spence et al. |
| 9,032,312 | B2 | 5/2015 | Barnes et al. |
| 9,275,482 | B1 | 3/2016 | Dannelongue |
| 10,113,408 | B2 | 10/2018 | Pobedinski et al. |
| 10,740,292 | B2 | 8/2020 | Haddad |
| 11,567,639 | B2 | 1/2023 | Rickard et al. |
| 11,650,728 | B2 | 5/2023 | Floren et al. |
| 11,816,555 | B2 | 11/2023 | Rickard et al. |
| 2004/0107085 | A1 | 6/2004 | Moosburger et al. |
| 2005/0010901 | A1 | 1/2005 | Udler |
| 2010/0050152 | A1 | 2/2010 | Gilboa |
| 2013/0289774 | A1* | 10/2013 | Day ..................... G06F 16/355 700/276 |
| 2015/0220311 | A1 | 8/2015 | Salter |
| 2015/0348310 | A1 | 12/2015 | Watanabe et al. |
| 2016/0097270 | A1 | 4/2016 | Pobedinski et al. |
| 2016/0110369 | A1 | 4/2016 | Cervelli et al. |
| 2016/0180466 | A1 | 6/2016 | Caldwell |
| 2016/0210270 | A1 | 7/2016 | Kelly et al. |
| 2018/0024731 | A1 | 1/2018 | Sanches et al. |
| 2018/0181093 | A1 | 6/2018 | Schulz et al. |
| 2018/0322396 | A1 | 11/2018 | Ahuja-Cogny et al. |
| 2018/0337940 | A1* | 11/2018 | Seiver .................. G06F 21/577 |
| 2020/0124753 | A1 | 4/2020 | Halsey et al. |
| 2020/0162340 | A1 | 5/2020 | Rossi et al. |
| 2020/0311199 | A1 | 10/2020 | Yan et al. |
| 2021/0119576 | A1 | 4/2021 | Padullaparthi et al. |
| 2022/0236965 | A1 | 7/2022 | Rahill-Marier et al. |
| 2023/0259263 | A1 | 8/2023 | Floren et al. |
| 2024/0037374 | A1 | 2/2024 | Rickard et al. |

FOREIGN PATENT DOCUMENTS

| | | |
|---|---|---|
| EP | 3869414 | 8/2021 |
| WO | WO 2022/056529 | 3/2022 |
| WO | WO 2022/159890 | 7/2022 |

OTHER PUBLICATIONS

U.S. Appl. No. 17/171,927, Interactive Graphical User Interfaces for Simulated Systems, filed Feb. 9, 2021.
U.S. Appl. No. 17/171,898, System and Methods for Chaining Discrete Models, filed Feb. 9, 2021.
U.S. Appl. No. 17/447,105, Interactive Graphical User Interfaces for Simulated Systems, filed Sep. 8, 2021.
U.S. Pat. No. 11,816,555, System and Methods for Chaining Discrete Models, Nov. 14, 2023.
Ahmed et al., "BranchConnect: Image Categorization with Learned Branch Connections", Mar. 12, 2018, IEEE Winter Conference on Applications of Computer Vision, pp. 1244-1253.
Ahmed et al., "MaskConnect: Connectivity Learning by Gradient Descent", Jul. 28, 2018, pp. 1-25.
Ba et al., "Blending Diverse Physical Priors with Neural Networks", Oct. 1, 2019, pp. 1-15.
Bellmann, "Interactive Simulations and advanced Visualization with Modelica," Proceedings of the 48th Scandinavian Conference on Simulation and Modeling (SIMS 2007), vol. 43, Oct. 8, 2009, pp. 541-550.
Bock et al. "Advantageous usage of textual domain-specific languages for scenario-driven development of automated driving functions." 2019 IEEE International Systems Conference (SysCon). IEEE, 2019.pp. 1-8.
Cai et al., "Link Prediction Approach for Opportunistic Networks Based on Recurrent Neural Network", 2019 IEEE Access, vol. 7, pp. 2017-2025.
Cai et al., "ProxylessNAS: Direct Neural Architecture Search on Target Task and Hardware", Feb. 23, 2019, pp. 1-13.
Casati et al. "Using patterns to design rules in workflows." IEEE Transactions on Software Engineering 26.8 (2000): pp. 760-785.
Chen et al., "Exploiting Structural and Temporal Evolution in Dynamic Link Prediction", Oct. 2018, CIKM'18, pp. 427-436.
Das et al., "Chains of Reasoning over Entities, Relations, and Text using Recurrent Neural Networks", May 1, 2017, 10 pages.
Gregor et al., "Learning Fast Approximations of Sparse Coding", Proceedings of the 27th International Conference on Machine Learning, 2010, 8 pages.
Guo et al., "A recurrent neural network based health indicator for remaining useful life prediction of bearings", 2017 Neurocomputing 240, pp. 98-109.
Han, Youngmahn. "Bioworks: a workflow system for automation of bioinformatics analysis processes." 2011 International Conference on Ubiquitous Computing and Multimedia Applications. IEEE, 2011.pp. 76-81.
Han et al. "Building an on-line geospatial analysis system with ajax and web services", 2009 Congress on Services-I, IEEE, 2009, pp. 408-413.
Kali et al., "Sliding Mode with Time Delay Control for MIMO Nonlinear Systems With Unknown Dynamics," 2015, 6 pages.
Kuhn et al., "Introspective Black Box Failure Predicition for Autonomous Driving", 2020 IEEE Intelligent Vehicles Symposium (IV), pp. 7.
Lei et al., "GCN-GAN: A Non-linear Temporal Link Prediction Model for Weighted Dynamics Networks", Jan. 26, 2019, 9 pages.
Liu et al., "DARTS: Differentiable Architecture Search", Apr. 23, 2019, pp. 1-13.
Mandal et al., "Integrating existing scientific workflow systems: the Kepler/Pegasus example", Proceedings of the 2nd workshop on Workflows in support of large-scale science, 2007, pp. 21-28.
Marru et al. "Apache airavata: a framework for distributed applications and computational workflows", Proceedings of the 2011 ACM workshop on Gateway computing environments, 2011, pp. 21-28.
Reichstein et al., "Deep learning and process understanding for data-driven Earth system science", Feb. 14, 2019, Nature vol. 566, pp. 195-204.
SCIL Systems & Control Innovation Lab, "The DLR Visualization Library," retrieved from the Internet: https://web.archive.org/web/20200813110336/https://www.systemcontrolinnovationlab.de/the-dlr-visualization/library/, Aug. 13, 2020, 3 pages.
Wright et al., "Real-Time Black-Box Modelling with Recurrent Neural Networks", Proceedings of the 22nd International Conference on Digital Audio Effects (DAFx-19), Sep. 2019, 9 pages.
Wu et al., "FBNet: Hardware-Aware Efficient ConvNet Design via Differentiable Neural Architecture Search", Dec. 14, 2018, pp. 1-10.

(56) References Cited

OTHER PUBLICATIONS

Zaamout et al., "Improving Neural Networks Classification Through Chaining", Sep. 11, 2012, Artificial Neural Networks and Machine Learning ICANN, 8 pages.

Official Communication for European Patent Application No. 21156704.5 dated Jul. 9, 2021, 7 pages.

Official Communication for European Patent Application No. 21156704.5 dated Oct. 6, 2023, 4 pages.

Official Communication for European Patent Application No. 21156705.2 dated Jul. 23, 2021, 11 pages.

International Search Report and Written Opinion for International Application No. PCT/US2021/071395 dated Dec. 14, 2021, 16 pages.

International Search Report and Written Opinion for International Application No. PCT/US2022/013705 dated Apr. 21, 2022, 14 pages.

Official Communication for European Patent Application No. 21156705.2 dated Jan. 3, 2024, 9 pages.

U.S. Pat. No. 11,567,639, Interactive Graphical User Interfaces for Simulated Systems, Jan. 31, 2023.

U.S. Pat. No. 11,816,555, System and Method for Chaining Discrete Models, Nov. 14, 2023.

U.S. Pat. No. 11,650,728, Interactive Graphical User Interfaces for Simulated Systems, May 15, 2023.

U.S. Appl. No. 18/483,056, System and Method for Chaining Discrete Models, filed Oct. 9, 2023.

U.S. Appl. No. 18/297,490, Interactive Graphical User Interfaces for Simulated Systems, filed Apr. 7, 2023.

U.S. Appl. No. 17/583,058, Auto-Generating Interactive Workflow User Interfaces for Simulated Systems, filed Jan. 24, 2022.

U.S. Appl. No. 18/591,590, Auto-Generating Interactive Workflow User Interfaces for Simulated Systems, filed Feb. 29, 2024.

* cited by examiner

INTERACTIVE GRAPHICAL USER INTERFACES FOR SIMULATED SYSTEMS

CROSS-REFERENCE TO RELATED APPLICATIONS

This application is a continuation of U.S. patent application Ser. No. 17/171,927, filed on Feb. 9, 2021, and titled "INTERACTIVE GRAPHICAL USER INTERFACES FOR SIMULATED SYSTEMS," now issued as U.S. Pat. No. 11,567,639, which application claims a priority benefit under 35 U.S.C. § 119 to U.S. Provisional Patent Application No. 62/976,558, filed on Feb. 14, 2020, the disclosure of each of which is hereby incorporated by reference herein in its entirety.

TECHNICAL FIELD

The present disclosure relates to models for simulating real world systems and interactive user interfaces for data integration, analysis, and visualization.

BACKGROUND

A database may store a large quantity of measurement data. For example, a system may comprise a large number of sensors that each collect measurements at regular intervals, and the measurements may be stored in the database. The measurement data can be supplemented with other data, such as simulated information based on the sensor measurements, and the supplemental data can also be stored in the database. In some cases, a user may attempt to analyze a portion of the stored data. For example, the user may attempt to analyze the simulated information. However, as the number of measurements increases over time, it can become very difficult for the user to identify, visualize, and perform analysis on the relevant measurement data.

SUMMARY

The systems, methods, and devices described herein each have several aspects, no single one of which is solely responsible for its desirable attributes. Without limiting the scope of this disclosure, several non-limiting features will now be discussed briefly.

Disclosed herein are various systems, computer program products, and computer-implemented methods for visualizing and interacting with various inputs, outputs, and other data resulting from a simulation of multiple models that collectively represent a real world system, e.g. a technical or physical real world system. For example, a graphical user interface (GUI) may include one or more panels to display objects and object properties. The objects and object properties may represent the inputs and outputs of the simulated models. The GUI may further comprise at least one of information, trend, simulation, mapping, schematic, time, equipment, and toolbar panels. These panels may display the objects, object properties, inputs, and outputs of the simulated models.

Moreover, the GUI may include a viewing and editing mode to view or edit at least one of the information, trend, simulation, mapping, schematic, time, equipment, and toolbar panels. These panels and modes lay the framework for how a user can properly visualize and analyze the models at a particular point in time or over a period of time. The visualization and analysis may be performed in real-time. For example, the trend panel in the viewing mode may display the trends for one or more object properties of an object for a given period of time. In the editing mode, the trend panel may allow the user to edit one or more object properties of an object at a specific time instant or for a period of time. The user may further minimize or maximize any panel to optimally achieve the user's display preferences for the system. The user may also markup the system using annotations, change graph line widths to represent different object properties, change the colors of various objects or object properties to represent the state of the corresponding object, view events that occurred in association with an object, and the like. The highly configurable and editable nature of the GUI allows any user the ability to visualize, simulate, and interact with the models that collectively represent a real world system in order to assist the user in monitoring and/or controlling the real world system by means of a continued and/or guided human-machine interaction process. In some of the embodiments the monitoring and/or controlling is performed in real-time.

Accordingly, in various embodiments, large amounts of data are automatically and dynamically calculated interactively in response to user inputs, and the calculated data is efficiently and compactly presented to a user by the system. Thus, in some embodiments, the user interfaces described herein are more efficient as compared to previous user interfaces in which data is not dynamically updated and compactly and efficiently presented to the user in response to interactive inputs. In some embodiments, the data is updated and presented to the user in real-time.

Further, as described herein, the system may be configured and/or designed to generate user interface data useable for rendering the various interactive user interfaces described. The user interface data may be used by the system, and/or another computer system, device, and/or software program (for example, a browser program), to render the interactive user interfaces. The interactive user interfaces may be displayed on, for example, electronic displays (including, for example, touch-enabled displays). The interactive user interfaces may allow a user to monitor and/or control various technical components and processes of technical real-world systems.

Additionally, it has been noted that design of computer user interfaces "that are useable and easily learned by humans is a non-trivial problem for software developers." (Dillon, A. (2003) User Interface Design. MacMillan Encyclopedia of Cognitive Science, Vol. 4, London: MacMillan, 453-458.) The various embodiments of interactive and dynamic user interfaces of the present disclosure are the result of significant research, development, improvement, iteration, and testing. This non-trivial development has resulted in the user interfaces described herein which may provide significant cognitive and ergonomic efficiencies and advantages over previous systems. The interactive and dynamic user interfaces include improved human-computer interactions that may provide reduced mental workloads, improved decision-making, reduced work stress, and/or the like, for a user. For example, user interaction with the interactive user interfaces described herein may provide an optimized display of time-varying report-related information and may enable a user to more quickly access, navigate, assess, and digest such information than previous systems.

In some embodiments, data may be presented in graphical representations, such as visual representations, such as charts and graphs, where appropriate, to allow the user to comfortably review the large amount of data and to take advantage of humans' particularly strong pattern recognition abilities related to visual stimuli. In some embodiments, the system may present aggregate quantities, such as totals, counts, and averages. The system may also utilize the information to interpolate or extrapolate, (e.g. forecast) future developments.

Further, the interactive and dynamic user interfaces described herein are enabled by innovations in efficient interactions between the user interfaces and underlying systems and components. For example, disclosed herein are improved methods of receiving user inputs, translation and delivery of those inputs to various system components, automatic and dynamic execution of complex processes in response to the input delivery, automatic interaction among various components and processes of the system, and automatic and dynamic updating of the user interfaces. The interactions and presentation of data via the interactive user interfaces described herein may accordingly provide cognitive and ergonomic efficiencies and advantages over previous systems. The manner of presentation assists the user in controlling various technical components and processes by means of a continued and/or guided human-machine interaction process.

In some of the embodiments, the methods and systems described herein may receive input from one or more real-world systems and may also provide output to one or more real-world systems. In some of these embodiments, (measured) parameter values are obtained from measuring devices or sensors in a (technical) real-world system, the parameter values may be used, for example, to train one or more models (e.g. based on machine learning) or a basic model is already provided and the parameter values are used to adapt to the real-world system and/or to further refine the model. The model then allows to simulate the (technical) real-word system and the insights/predictions obtained via the simulation may again be used for monitoring and/or controlling the real-world system, e.g. using actuators, via the interactive and dynamic graphical user interfaces that are described herein. Such an approach may be employed, for example, to monitor and/or control a water treatment physical system or any other real-world system as will be explained in more detail below.

Various embodiments of the present disclosure provide improvements to various technologies and technological fields. For example, existing data storage and processing technology (including, e.g., in memory databases) is limited in various ways (e.g., manual data review is slow, costly, and less detailed; data is too voluminous; etc.), and various embodiments of the disclosure provide significant improvements over such technology. Additionally, various embodiments of the present disclosure are inextricably tied to computer technology. In particular, various embodiments rely on detection of user inputs via graphical user interfaces, calculation of updates to displayed electronic data based on those user inputs, automatic processing of related electronic data, and presentation of the updates to displayed images via interactive graphical user interfaces. Such features and others (e.g., processing and analysis of large amounts of electronic data) are intimately tied to, and enabled by, computer technology, and would not exist except for computer technology. For example, the interactions with displayed data described below in reference to various embodiments cannot reasonably be performed by humans alone, without the computer technology upon which they are implemented. Further, the implementation of the various embodiments of the present disclosure via computer technology enables many of the advantages described herein, including more efficient interaction with, and presentation of, various types of electronic data.

Additional embodiments of the disclosure are described below in reference to the appended claims, which may serve as an additional summary of the disclosure.

In various embodiments, systems and/or computer systems are disclosed that comprise a computer readable storage medium having program instructions embodied therewith, and one or more processors configured to execute the program instructions to cause the one or more processors to perform operations comprising one or more aspects of the above- and/or below-described embodiments (including one or more aspects of the appended claims).

In various embodiments, computer-implemented methods are disclosed in which, by one or more processors executing program instructions, one or more aspects of the above- and/or below-described embodiments (including one or more aspects of the appended claims) are implemented and/or performed.

In various embodiments, computer program products comprising a computer readable storage medium are disclosed, wherein the computer readable storage medium has program instructions embodied therewith, the program instructions executable by one or more processors to cause the one or more processors to perform operations comprising one or more aspects of the above- and/or below-described embodiments (including one or more aspects of the appended claims).

One aspect of the disclosure provides a computer-implemented method for visualizing and interacting with a plurality of models depicted in a graphical user interface. The computer-implemented method comprises: by one or more processors executing program instructions: obtaining the plurality of models, wherein the plurality of models comprises a first model and a second model; obtaining first time-series data corresponding to the first model and second time-series data corresponding to the second model; simulating the first and second models using at least a portion of the first time-series data or the second time-series data; and generating user interface data that, when rendered by a user device, causes the user device to display a graphical user interface comprising a first panel, wherein the first panel depicts a result of the simulation of the first and second models, wherein the method is performed using one or more processors.

The computer-implemented method of the preceding paragraph can include any sub-combination of the following features: where the graphical user interface further comprises a second panel depicting a plurality of objects corresponding to the first model; where optionally the plurality of objects comprises a first object, and wherein the first object is depicted in the second panel in association with a first color to indicate a state of the first object; where the plurality of objects comprises a first object, and wherein a width of a line coupled to the first object in the second panel represents a value of an object property of the first object; where the plurality of objects comprises a first object, and wherein the second panel further depicts an indication of an event associated with the first object; where optionally the event comprises one of a weather event, deferral event, or a maintenance event; where optionally the second panel depicts a schematic of the plurality of objects; where the graphical user interface further comprises a second panel depicting one or more subsystems corresponding to the first model; where the second panel depicts a schematic of the one or more subsystems; where optionally the one or more subsystems comprises a plurality of objects corresponding to the first model; where the first panel further depicts a second result of a second simulation of the first and second models;

where the first panel depicts the result and the second result as a time-series graph; where optionally the graphical user interface further comprises a second panel depicting a first object corresponding to the first model and an indication of an event associated with the first object, and where one or more portions of the time-series graph changes color based on the indication of the event; where optionally one or more portions of a time-series data line of the time-series graph changes color based on a status of an object property of an object of the first model; where the first model is one of a known or black box system; where the graphical user interface further comprises a time slider; where the time slider changes color based on a status of an object property of an object of the first model; and where the computer-implemented method further comprises receiving an indication of a request to note or markup the graphical user interface with one or more annotations.

Another aspect of the disclosure provides a system for visualizing and interacting with a plurality of models depicted in a graphical user interface. The system comprises one or more non-transitory computer readable storage mediums storing program instructions. The system further comprises one or more processors configured to execute the program instructions, wherein the program instructions, when executed by the one or more processors, cause the system to: obtain the plurality of models, wherein the plurality of models comprises a first model and a second model; obtain first time-series data corresponding to the first model and second time-series data corresponding to the second model; simulate the first and second models using at least a portion of the first time-series data or the second time-series data; and generate user interface data that, when rendered by a user device, causes the user device to display a graphical user interface comprising a first panel, wherein the first panel depicts a result of the simulation of the first and second models.

Another aspect of the disclosure provides non-transitory, computer-readable storage media comprising computer-executable instructions for visualizing and interacting with a plurality of models depicted in a graphical user interface, wherein the computer-executable instructions, when executed by a computer system, cause the computer system to: obtain the plurality of models, wherein the plurality of models comprises a first model and a second model; obtain first time-series data corresponding to the first model and second time-series data corresponding to the second model; simulate the first and second models using at least a portion of the first time-series data or the second time-series data; and generate user interface data that, when rendered by a user device, causes the user device to display a graphical user interface comprising a first panel, wherein the first panel depicts a result of the simulation of the first and second models.

Further, as described herein, various embodiments of the system may be configured and/or designed to generate user interface data useable for rendering the various interactive user interfaces described. The user interface data may be used by the system, and/or another computer system, device, and/or software program (for example, a browser program), to render the interactive user interfaces. The interactive user interfaces may be displayed on, for example, electronic displays (including, for example, touch-enabled displays).

The term "comprising" as used herein should be given an inclusive rather than exclusive interpretation. For example, a general purpose computer comprising one or more processors should not be interpreted as excluding other computer components, and may possibly include such components as memory, input/output devices, and/or network interfaces, among others.

The details of one or more variations of the subject matter described herein are set forth in the accompanying drawings and the description below. Other features and advantages of the subject matter described herein will be apparent from the description and drawings, and from the claims. The disclosed subject matter is not, however, limited to any particular embodiment disclosed.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations as provided below.

Figure 1:
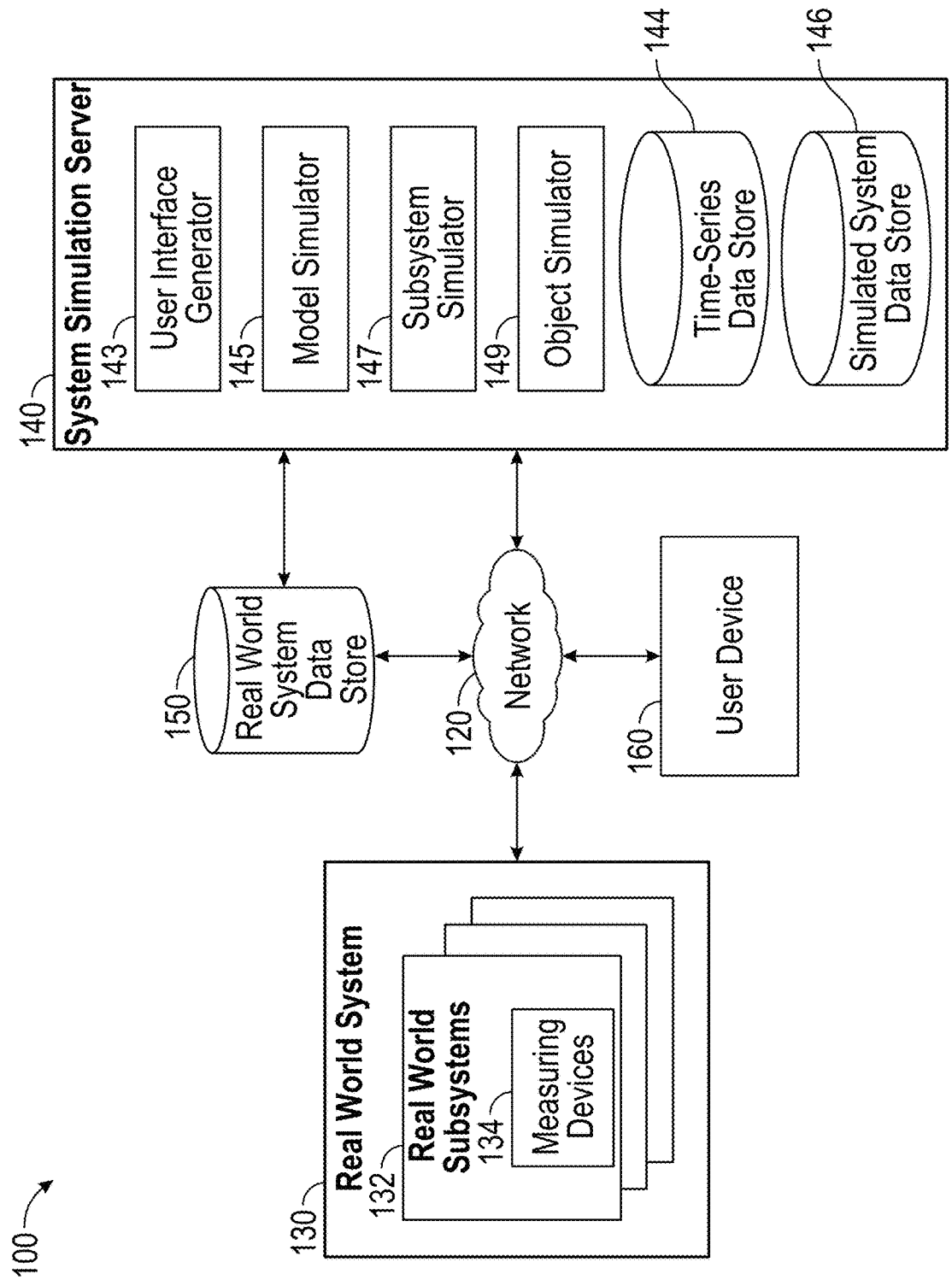
FIG. 1 is a block diagram illustrating a system for visualizing and interacting with a plurality of models depicted in a graphical user interface.

The figures may not be to scale in absolute or comparative terms and are intended to be exemplary. The relative placement of features and elements may have been modified for the purpose of illustrative clarity. Where practical, the same or similar reference numbers denote the same or similar or equivalent structures, features, aspects, or elements, in accordance with one or more embodiments.

DETAILED DESCRIPTION

In the following, numerous specific details are set forth to provide a thorough description of various embodiments. Certain embodiments may be practiced without these specific details or with some variations in detail. In some instances, certain features are described in less detail so as not to obscure other aspects. The level of detail associated with each of the elements or features should not be construed to qualify the novelty or importance of one feature over the others.

Terms

In order to facilitate an understanding of the systems and methods discussed herein, a number of terms are defined below. The terms defined below, as well as other terms used herein, should be construed to include the provided definitions, the ordinary and customary meaning of the terms, and/or any other implied meaning for the respective terms. Thus, the definitions below do not limit the meaning of these terms, but only provide exemplary definitions.

Data Store: Any computer readable storage medium and/or device (or collection of data storage mediums and/or devices). Examples of data stores include, but are not limited to, optical disks (e.g., CD-ROM, DVD-ROM, etc.), magnetic disks (e.g., hard disks, floppy disks, etc.), memory circuits (e.g., solid state drives, random-access memory (RAM), etc.), and/or the like. Another example of a data store is a hosted storage environment that includes a collection of physical data storage devices that may be remotely accessible and may be rapidly provisioned as needed (commonly referred to as "cloud" storage).

Database: Any data structure (and/or combinations of multiple data structures) for storing and/or organizing data, including, but not limited to, relational databases (e.g., Oracle databases, PostgreSQL databases, etc.), non-relational databases (e.g., NoSQL databases, etc.), in-memory databases, spreadsheets, as comma separated values (CSV) files, eXtendible markup language (XML) files, TeXT (TXT) files, flat files, spreadsheet files, and/or any other widely used or proprietary format for data storage. Databases are typically stored in one or more data stores. Accordingly, each database referred to herein (e.g., in the description herein and/or the figures of the present application) is to be understood as being stored in one or more data stores.

Data Object or Object: A data container for information representing specific things in the world that have a number of definable properties. For example, a data object can represent an entity such as a person, a place, an organization, a market instrument, or other noun. A data object can represent an event that happens at a point in time or for a duration. A data object can represent a document or other unstructured data source such as an e-mail message, a news report, or a written paper or article. Each data object may be associated with a unique identifier that uniquely identifies the data object. The object's attributes (e.g., metadata about the object) may be represented in one or more properties.

Link: A connection between two data objects, based on, for example, a relationship, an event, and/or matching properties. Links may be directional, such as one representing a payment from person A to B, or bidirectional.

Link Set: Set of multiple links that are shared between two or more data objects.

Measuring Device or Sensor: A device, system, or collection of devices or systems that can provide information associated with an entity (e.g., device, system, gauge, instrument, detector, antenna, monitor, or any kind of scope, meter, or graph). For example, a sensor may provide reporting values (e.g., measurements or other information) associated with a manufacturing instrument. The received values may comprise values related to physical attributes or measurements (e.g., temperature, pressure, size, etc.), values related to virtual activity or measurements (e.g., network traffic, IP addresses, etc.), and/or the like. The information provided by sensors may be utilized and analyzed for various purposes.

Model: A representation of one or more entities (e.g., systems, subsystems, objects) and the relationships between the one or more entities. The entities and/or the relationships which represent the model may not be disclosed and thus a model may be "unknown" or "black box", whereas if the entities and/or relationships which represent the model may be disclosed then the model may be "known".

Node: Contains data (e.g., parameters) and may link to other nodes. A node may represent information contained in a data structure.

Object Type: Type of a data object (e.g., Person, Event, or Document). Object types may be defined by an ontology and may be modified or updated to include additional object types. An object definition (e.g., in an ontology) may include how the object is related to other objects, such as being a sub-object type of another object type (e.g., an agent may be a sub-object type of a person object type), and the properties the object type may have.

Ontology: Stored information that provides a data model for storage of data in one or more databases. For example, the stored data may comprise definitions for data object types and respective associated property types. An ontology may also include respective link types/definitions associated with data object types, which may include indications of how data object types may be related to one another. An ontology may also include respective actions associated with data object types. The actions associated with data object types may include defined changes to values of properties based on various inputs. An ontology may also include respective functions, or indications of associated functions, associated with data object types, which functions may be executed when a data object of the associated type is accessed. An ontology may constitute a way to represent things in the world. An ontology may be used by an organization to model a view on what objects exist in the world, what their properties are, and how they are related to each other. An ontology may be user-defined, computer-defined, or some combination of the two. An ontology may include hierarchical relationships among data object types.

Parameter: A measurable factor or characteristic that may define or classify a system (e.g., a model).

Properties: Attributes of a data object that represent individual data items. At a minimum, each property of a data object has a property type and a value or values.

Property Type: The type of data a property is, such as a string, an integer, or a double. Property types may include complex property types, such as a series data values associated with timed ticks (e.g., a time-series), etc.

Property Value: The value associated with a property, which is of the type indicated in the property type associated with the property. A property may have multiple values.

Subsystem: A self-contained system within a larger system.

System: A set or group of interacting or interrelated entities (e.g., subsystems, objects) that form a unified whole or an interconnecting network.

Introduction

Multiple data models may be used to accurately and/or approximately simulate a real world system (e.g., an actual system present in the real world, such as a physical system, a logical system (e.g., a supply chain), a technical system, etc.). Visualizing a simulation of these data models, however, is challenging because these data models may be constructed by different teams or organizations, use different objects and object properties, and contain known or black box (e.g., unknown) components. Therefore, though a user may have multiple data models to work with and analyze, visualizing how the data models interact together during a simulation of a real world system can be difficult. Visualizing the interaction of the data models is often useful in understanding the real world system. For example, properly visualizing simulations of the data models over time can be useful in understanding how the real world system may perform, specifically at a particular point in time, over a period of time or in real-time.

It may be beneficial to be able to visualize a simulation of a real world system based on the data models so that the impact a broken object in a particular data model has on another data model can be viewed, trends in how objects interact can be charted over time, an optimal coupling of data models can be viewed, etc. Thus, a system that can visualize the interaction of multiple data models that collectively represent a real world system can achieve the technical benefits described above and be used to design more accurate real world systems.

To overcome the technical deficiencies outlined above, disclosed herein is a system, computer program product, and computer-implemented method for visualizing various inputs, outputs, and other data resulting from a simulation of multiple models that collectively represent a real world system, e.g. a real world technical system. For example, live sensor data can be provided as an input to one or more of the simulated models which represent, for example, a technical system in the real world. In response, a graphical user interface (GUI) can be generated that includes one or more panels to display technical objects (e.g., pumps, compressors, valves, machinery, welding stations, vats, containers, products or items, organizations, countries, counties, factories, customers, hospitals, etc.) and/or technical object properties (e.g., flow rate, suction temperature, volume, capacity, order volume, sales amounts, sales quantity during a time period (e.g., a day, a week, a year, etc.), population density, patient volume, etc.). The technical objects and technical object properties represent the inputs and outputs of the simulated models. The GUI further comprises at least one of information, schematic, trend, simulation, time, equipment, toolbar, or mapping panels. These panels display the objects, object properties, inputs, and outputs of the simulated models.

Moreover, the GUI can include a viewing and editing mode. In the viewing mode, the user may view the displayed information, schematic, trend, simulation, time, equipment, toolbar, and/or mapping panels. In the editing mode, the user may edit the displayed information, schematic, trend, simulation, time, equipment, toolbar, and/or mapping panels. These panels and modes lay the framework for how a user can properly visualize and analyze the models at a particular point in time or over a period of time. For example, the trend panel in the viewing mode may display the trends for one or more technical object properties (e.g., temperature, pressure, flow rate, etc.) of a technical object (e.g., a pump) for a given period of time (e.g., Monday to Wednesday). In the editing mode, the trend panel may allow the user to edit one or more object properties of an object at a specific time instant (e.g., Monday at noon) or for a period of time (e.g., Monday to Wednesday). The user can further minimize or maximize any panel to optimally achieve the user's display preferences for the system. The user can also markup the system using annotations, change graph line widths to represent different object properties, configure the coloring of various objects or object properties to change automatically based on the state (e.g., open, closed, running above specification, running below specification, etc.) of the corresponding object, view events (e.g., weather events, maintenance events) that occurred in association with an object, and/or the like. Thus, the highly configurable and editable nature of the GUI allows any user the ability to visualize, simulate, and interact with the models that collectively represent a real world system. Further, a well-designed GUI allows for analysts to more quickly analyze data that, when presented in other formats, would be analyzed much more slowly. See Dillon, A. (2003) User Interface Design. MacMillan Encyclopedia of Cognitive Science, Vol. 4, London: MacMillan.

Exemplary System Overview

FIG. 1 illustrates a block diagram showing the various components of a system 100 for visualizing and interacting with a plurality of models that collectively represent a real world system depicted in a graphical user interface.

As illustrated in FIG. 1, the system 100 may include a real world system 130, a system simulation server 140, a real world system data store 150, and a user device 160. In an embodiment, the real world system 130, the system simulation server 140, the real world system data store 150, and the user device 160 communicate via a network 120. In other embodiments, there may be multiple real world systems 130. These multiple real world systems 130 may be of the same and/or different types. Further the multiple real world systems 130 may also communicate via the network 120. Similarly, the functionality disclosed with reference to these components may be distributed to other computing devices and/or partially performed by multiple computing devices.

The real world system 130 may be a logical system, such as a representation of a supply chain. The real world system 130 can also be a physical system that has a structure that comprises various components and equipment and may be located in various areas. For example, the real world system 130 may be located at an environmental monitoring and/or research site such as a volcano, an ocean, a river, a lake, an ice sheet, a forest, and/or the like. In another example, the real world system 130 may be a technical system, e.g. a manufacturing site, such as a location in which machinery is used to make articles. In another example, the real world system 130 may be a vehicle such as a car, a bus, an airplane, a train, a boat, a bicycle and/or the like. In another example, the real world system 130 may be a mine, a water production or treatment system, a water pipeline, an irrigation system, and/or the like.

The real world system 130 may further include a plurality of real world subsystems 132. The real world subsystems 132 may make up the real world system 130. For example, the real world subsystems 132 may be a logical subsystem (e.g., a supply chain subsystem, such as a group of activities performed at a particular location like a distribution center). As another example, the real world subsystems 132 may be a physical or technical subsystem, such as a pumping subsystem, a separation subsystem, and a compression subsystem that make up a water treatment physical system. As another example, the real world subsystems 132 may be a movement detection subsystem, a gas detection subsystem, and/or other related subsystems that form a volcano monitoring physical system.

A plurality of logical computations (e.g., order volume, sales quantity during a time period, etc.), sensors, and/or measuring devices 134 may couple to the real world subsystems 132. For example, the real world subsystem 132 may include one or more logical computations if the real world subsystem 132 is a logical subsystem. The logical computations 134 may detect or measure statistics or other numerical values associated with the object (e.g., an item, a product, etc.) passing through the logical subsystem. As another example, the real world subsystem 132 may include one or more sensors and/or measuring devices if the real world subsystem 132 is a physical or technical subsystem. As an illustrative example, a compression subsystem may include a sensor and/or measuring device coupled to a compressor and a sensor and/or measuring device coupled to a compressor valve. As another illustrative example, a movement detection system may include a seismograph, a motion detector, a camera, and/or the like. The sensors and/or measuring devices 134 may detect or measure physical properties, such as pressure, flow rate, acoustic signals, temperature or changes in temperature, vehicle speed, motion, images, and/or the like.

In some embodiments, the real world subsystems 132 may not exist and only a real world system 130 includes the plurality of logical computations, sensors, and/or measuring devices 134. For example, a supply chain system may include one or more logical computations associated with the supply chain itself. As another example, a water pipeline physical system may include a sensor and/or measuring device coupled to the water pipeline. Another example may include a manufacturing site physical system that may include sensors and/or measuring devices coupled to a machinery physical subsystem so that monitoring of the operation of machinery at the manufacturing site and variations in manufacturing conditions, such as temperature, efficiency, output, etc., and/or the like may occur. Another example may include an airplane physical system that may include sensors and/or measuring devices coupled to one or more airplane physical subsystems, such as the engine, the transmission, the flaps, the propeller, the wheels, the landing gear, the exhaust, the rudder, etc., to track operation of the airplane physical subsystems, monitor weather conditions, identify deviations from an expected travel route, track fuel efficiency, and/or the like. The examples described herein are not meant to be limiting.

The real world system 130 may further include logical computations, sensors, and/or measuring devices 134 coupled to real world subsystems 132 that directly transmit the measurement data over the network 120 to the system simulation server 140. In another embodiment, the real world system 130 may include logical computations, sensors, and/or measuring devices 134 coupled to real world subsystems 132 that transmit the measurement data over the network 120 to the real world system data store 150. In another embodiment, the real world system 130 may include logical computations, sensors, and/or measuring devices 134 coupled to real world subsystems 132 that transmit the measurement data over the network 120 to the user device 160.

The system simulation server 140 may include various data stores and executable code modules. In an embodiment, the system simulation server 140 may include a user interface generator 143, a model simulator 145, a subsystem simulator 147, an object simulator 149, a time-series data store 144, and a simulated system data store 146. In an embodiment, the user interface generator 143, the model simulator 145, the subsystem simulator 147, and the object simulator 149 are each implemented as executable code modules that are stored in the memory of, and executed by one or more processors of, the system simulation server 140. The user interface generator 143, model simulator 145, the subsystem simulator 147, and the object simulator 149 may also be implemented partly or wholly in application-specific hardware.

In some embodiments, the executable code modules of the system simulation server 140 may call an application programming interface (API) to perform various functions. The executable code modules may receive data via the network 120 and/or from the real world system data store 150, time-series data store 144, and/or simulated system data store 146. One or more of the data stores may be databases. Each of the real world system data store 150, time-series data store 144, and/or simulated system data store 146 may store data items of various types, as described herein.

The real world system data store 150 may store and provide to the network 120, and/or to the system simulation server 140, various data items that may be related to logical computations, measuring devices, physical subsystems, technical subsystems, logical subsystems, physical systems, technical systems and logical systems. For example, such data items may include a statistic related to a product or item that is the subject of a supply chain, a measurement of a measuring device, a category of a physical or logical subsystem, a health of a physical or logical system, and/or other like data items.

The time-series data store 144 may store and provide to the network 120, real world system data store 150 and/or to the other various data stores and executable code modules within the system simulation server 140, various data items related to objects, subsystems, and/or measured or generated over a period of a time and/or at a specific point in time. For example, such data items may include a shelf life of an object, a schedule of a subsystem, historical information of a model, and/or other like data items.

The simulated system data store 146 may store and provide to the network 120, real world system data store 150, and/or to the other various data stores and/or executable code modules within the system simulation server 140, various data items related to objects, subsystems, and/or models generated as a result of a simulation of the objects, subsystems, and/or models. For example, such data items may include a virtual copy of a physical object and related properties, a virtual subsystem simulated from a physical or logical subsystem, a model characterized by a physical or logical system, and/or other like data items.

While the time-series data store 144 and simulated system data store 146 are illustrated as being stored in the system simulation server 140, this is not meant to be limiting. The time-series data store 144 and/or simulated system data store 146 may be external to the system simulation server 140 and may communicate via network 120.

The model simulator 145 may simulate one or more real world systems 130, and/or other like physical, technical or logical structures to obtain and/or generate one or more models. In some embodiments, the one or more models may be known (e.g., the relationships, subsystems and/or objects that make up the model based on the real world systems 130 and/or other like physical, technical or logical structures that the one or more models may simulate are known). In some embodiments, the one or more models may be black box or unknown (e.g., the relationships, subsystems and/or objects that make up the one or more models based on the real world systems 130 and/or other like physical, technical or logical structures that the models may simulate may not be all known such that at least one parameter of the black box models is unknown). In some embodiments, the model simulator 145 may be one or more third party physics and/or simulation engines that may simulate one or more known and/or black box models.

The subsystem simulator 147 may simulate one or more real world subsystems 132 and/or other like subsystem structures of the real world system 130. In some embodiments, the subsystem simulator 147 may extract subsystem data (e.g., data of the physical or logical subsystems, present in the real world system data store 150) to perform the simulation. For example, in the case of a water treatment system, the subsystem data may include parameters or measured data values originating from a water sedimentation subsystem, a water filtration subsystem, a water disinfection subsystem, and/or the like.

The object simulator 149 may simulate one or more technical objects (e.g., measuring devices, components etc.) of the real world subsystem 132 and/or real world system 130. In some embodiments, the object simulator 149 may extract object data (e.g., measuring device data, logical computation data (e.g., statistical values), etc.) present in the real world system data store 150 to perform the simulation. The data may include unusual or periodic (e.g., some component oscillating) object properties or events that may have occurred (e.g., historical object properties) during operation of the real world system 130, real world subsystem 132, or any other structure in which the logical computations, sensors, and/or measuring devices 134 are present. For example, in the case of a supply chain, the technical object properties may include a time that an item or product was shipped from one location to another location, a time that an item or product arrived at a particular location, etc. As another example, in the case of a water treatment system, the technical object properties may include particles settling to a bottom of a water storage tank during the water sedimentation process, a structural vibration in a component or a piece of equipment of the water treatment system, a failure of a component or a piece of equipment of the water treatment system, and/or the like.

The user interface generator 143 may generate user interface code or data that, when executed (e.g., by a user device 160), causes a user device 160 to render and/or display a user interface that comprises one or more panels, where the panel(s) may comprise model, subsystem, and/or object data generated or obtained over a period of time. The user interface rendered as a result of the user interface code generated by the user interface generator 143 may be an "interactive GUI" or "interactive user interface" comprised of one or more panels. The use of the term "interactive GUI" or "interactive user interface" may be used interchangeably herein. The one or more panels may display technical objects (e.g., pumps, compressors, valves, machinery, welding stations, vats, containers, products or items, factories, customers, hospitals, etc.) and/or technical object properties (e.g., flow rate, suction temperature, volume, capacity, order volume, sales amounts, sales quantity during a time period (e.g., a day, a week, a year, etc.), patient volume, etc.) simulated by the object simulator 149. The interactive user interface visualizes and allows a user to interact with at least one of an information, schematic, trend, simulation, time, equipment, toolbar, and/or mapping panel. These panels display the subsystems, objects, object properties, inputs, outputs, and/or connections therein of the simulated models.

The interactive user interface rendered and/or displayed as a result of the user interface code generated by the user interface generator 143 may include a viewing mode and/or an editing mode. In the viewing mode, the user may view the displayed information, schematic, trend, simulation, time, equipment, toolbar, and/or mapping panels. In the editing mode, the user may edit the displayed information, schematic, trend, simulation, time, equipment, toolbar, and/or mapping panels. These panels and modes lay the framework for how a user can properly visualize and analyze the models at a particular point in time or over a period of time.

For example, the trend panel in the viewing mode may display the trends for one or more technical object properties (e.g., temperature, pressure, flow rate, order volume, sales amounts, sales quantity during a time period (e.g., a day, a week, a year, etc.), patient volume, etc.) of a technical object (e.g., a pump, a product or item, a factory, a customer, a hospital, etc.) for a given period of time (e.g., Monday to Wednesday). In the editing mode, the trend panel may allow the user to edit one or more object properties of an object at a specific time instant (e.g., Monday at noon) or for a period of time (e.g., Monday to Wednesday). The user can further minimize or maximize any panel to optimally achieve the user's display preferences for the system. The user can also markup the system using annotations, change graph line widths to represent different object properties, change the colors of various objects or object properties to represent the state (e.g., open, closed, running above specification, running below specification, etc.) of the corresponding object, and/or the like.

The user interface generator 143 may be configured to generate user interface code or data that, when executed, results in additional features being depicted in the rendered and/or displayed interactive user interface. For example, the interactive user interface may allow the user to scroll on any of the displayed panels and/or change a zoom level of the displayed panels to view information at different depths and/or times.

In some embodiments, the interactive user interface may be configured to allow a user to view or edit error detection data (e.g., information associated with the detection of a malfunction or miscalibration of measuring devices 134 and/or real world subsystems 132 depicted in at least one of the displayed panels). For example, the interactive user interface can display a message indicating that a fault is detected when such an error is detected by the logical computations, sensors, and/or measuring devices 134 and/or real world subsystems 132 depicted in at least one of the displayed panels.

The real world system data store 150 may store the error detection data that may indicate a real world subsystem 132, logical computation, and/or physical sensor error in one or more real world systems 130. The real world systems 130 may be known or transparent systems and/or black box systems.

The model simulator 145 may obtain, generate, and/or simulate one or more models based on the one or more real world systems 130 and/or the error detection data stored in the real world system data store 150. The one or more models may be stored in the simulated system data store 146. The error detection data from the real world system data store 150 may include when the real world subsystem 132, logical computations, and/or physical sensor error may have occurred over a period of time (e.g., historical sensor error data, live sensor data, real-time sensor data, etc.) and may store this time-series data in the time-series data store 144. The model simulator 145 may transmit the various models and/or data from the time-series data store 144 and/or the simulated system data store 146 to the object simulator 149 to generate objects (e.g., virtual items or products, virtual sensors, virtual measuring devices, etc.) and/or to the subsystem simulator 147 to generate subsystems (e.g., virtual subsystems that may further include the set of virtual logical computations, virtual sensors, virtual measuring devices, etc.). If no real world subsystem, logical computations, and/or physical sensor error has occurred, the one or more model relationships, subsystems and/or objects may closely mirror the actual real world subsystem, logical computations, and/or physical sensors. The model simulator 145 may compare actual real world subsystem 132, logical computations, and/or physical sensor data with simulated data of the one or more simulated models (e.g., data from the generated virtual logical computations, virtual sensors, virtual measuring devices, virtual subsystems, etc.). If the difference between the two datasets is greater than a threshold value, then the model simulator 145 may determine that a virtual subsystem and/or virtual sensor error has occurred. The system simulation server 140 (e.g., the model simulator 145) may use the difference between the two datasets to determine the health of a subsystem (e.g., virtual subsystem), object (e.g., virtual item or product, virtual sensor, etc.), and/or object property (e.g., measurement of the virtual sensor), and display the health on at least one of the displayed panels. The system simulation server 140 (e.g., the model simulator 145) may determine that a smaller difference may result in a healthier subsystem, object, and/or object property, and therefore indicate a healthier model given that these components make up the model.

Additionally the interactive user interface may be configured to allow a user to view or edit, in at least one of the displayed panels, unusual (e.g., abnormal) or periodic events that have occurred and/or that may occur in the future during operation of the logical computations, sensors, and/or measuring devices 134 and/or real world subsystems 132. Such events may also apply to the simulated virtual objects (e.g., virtual items or products, virtual measuring devices, and/or virtual subsystems). For example, in the case of a supply chain, the object properties may include a time that an item or product was shipped from one location to another location, a time that an item or product arrived at a particular location, etc. In the case of a water treatment system, events may include particles settling to a bottom of a water storage tank during the water sedimentation process, a structural vibration in a component or a piece of equipment of the water treatment system, a failure of a component or a piece of equipment of the water treatment system, maintenance being performed on a component or equipment of the water treatment system, deferral of a component or equipment of the water treatment system, and/or the like. In the case of a manufacturing site, events may include machinery malfunction, a structural vibration in a part of the machinery, changes in manufacturing conditions (e.g., temperature, efficiency, output, etc.), and/or the like. In the case of a vehicle, events may include a component malfunction, a change in a weather condition (e.g., humidity, wind speed, temperature, etc.), a weather phenomenon (e.g., icing, a lightning strike, a large wave, a tornado, etc.), deviations from an expected travel route (e.g., a change from an expected route determined by a navigation system, a change from the flight plan, etc.), a change in fuel efficiency, and/or the like. In the case of a fracking site, events may include the movement of fluids across various depths, changes in the rock layer, equipment failure, and/or the like. In the case of an environmental monitoring and/or researching site, events may include seismic activity (e.g., as caused by tectonic plates, volcanoes, etc.), ice breakage, lava flow, weather phenomena, and/or the like. In the case of a mine, events may include rock movements, rock burst bumps (e.g., seismic jolts within the mine), blasts, micro-seismic events (e.g., events associated with impending ground control problems like roof collapses or other structural failures), equipment failure, and/or the like. In the case of other types of logical computations, sensors, and/or measuring devices 134 and/or real world subsystems 132, events can include misalignment of parts on a manufacturing machine, trees falling, landslides, mudslides, avalanches, and/or the like. Although several specific cases are mentioned as example events that have occurred and/or that may occur during operation, this is merely illustrative and not meant to be limiting. For example, maintenance, deferral, weather, equipment failure, delivery delays, re-routing of items or products, order cancellation, etc. are other events that may occur in other cases.

The system simulation server 140 may be implemented as a special-purpose computer system having logical elements. In an embodiment, the logical elements may comprise program instructions recorded on one or more machine-readable storage media. Alternatively, the logical elements may be implemented in hardware, firmware, or a combination thereof. In one embodiment, the system simulation server 140 may be implemented in a Java Virtual Machine (JVM) that is executing in a distributed or non-distributed computer system. In other embodiments, the system simulation server 140 may be implemented as a combination of programming instructions written in any programming language (e.g., C++, Visual Basic, Python, etc.) and hardware components (e.g., memory, CPU time) that have been allocated for executing the program instructions.

A user may use the user device 160 to view and interact with the interactive user interface. For example, the user device 160 may be in communication with the system simulation server 140 via a network 120. The user device 160 can include a wide variety of computing devices, including personal computing devices, terminal computing devices, laptop computing devices, tablet computing devices, electronic reader devices, mobile devices (e.g., mobile phones, media players, handheld gaming devices, etc.), wearable devices with network access and program execution capabilities (e.g., "smart watches" or "smart eyewear"), wireless devices, set-top boxes, gaming consoles, entertainment systems, televisions with network access and program execution capabilities (e.g., "smart TVs"), and various other electronic devices and appliances. The user devices 160 may execute a browser application to communicate with the system simulation server 140.

In an embodiment, the network 120 includes any communications network, such as the Internet. The network 120 may be a wired network, a wireless network, or a combination of the two. For example, network 120 may be a local area network (LAN) and/or a wireless area network (WAN). The network 120 may include cables and/or other equipment that allow the transport of data from underwater locations to above-ground locations and/or vice-versa. For example, the network 120 may include one or more firewalls (e.g., a firewall that provides an interface between the real world system 130 and the other components of the network 120 and/or a firewall that provides an interface between the other components of the network 120 and the system simulation server 140 and/or the real world system data store 150) and/or an endpoint server, such as a secure HTTP endpoint system.

Example User Interfaces

Advantageously, the present disclosure allows users to interact with and analyze electronic data in a more analytically useful way. Graphical user interfaces (GUIs) allow the user to visualize otherwise obscure relationships and patterns between different data objects, subsystems, and models. Further these data models may be constructed by different teams or organizations, use different objects and object properties, and contain known and/or black box components. Therefore, though a user may have multiple data models to work with and analyze, visualizing and interacting with the data models that model or simulate the desired real world system can be difficult. Absent the techniques, operations, and functionality disclosed herein, it may be impossible to identify and/or use relationships and patterns between different data objects, subsystems, and/or models given the size and diversity of the different types of models (e.g., black box models, known or transparent models (e.g., simulation engines), models with specific components (e.g., subsystems and data objects), etc.).

For illustrative purposes, FIGS. 2-8 depict user interfaces corresponding to physical systems. This is not meant to be limiting, however. For example, the content and/or features of the user interfaces described herein may be provided and/or depicted in user interfaces corresponding to logical systems as well.

Figure 2:
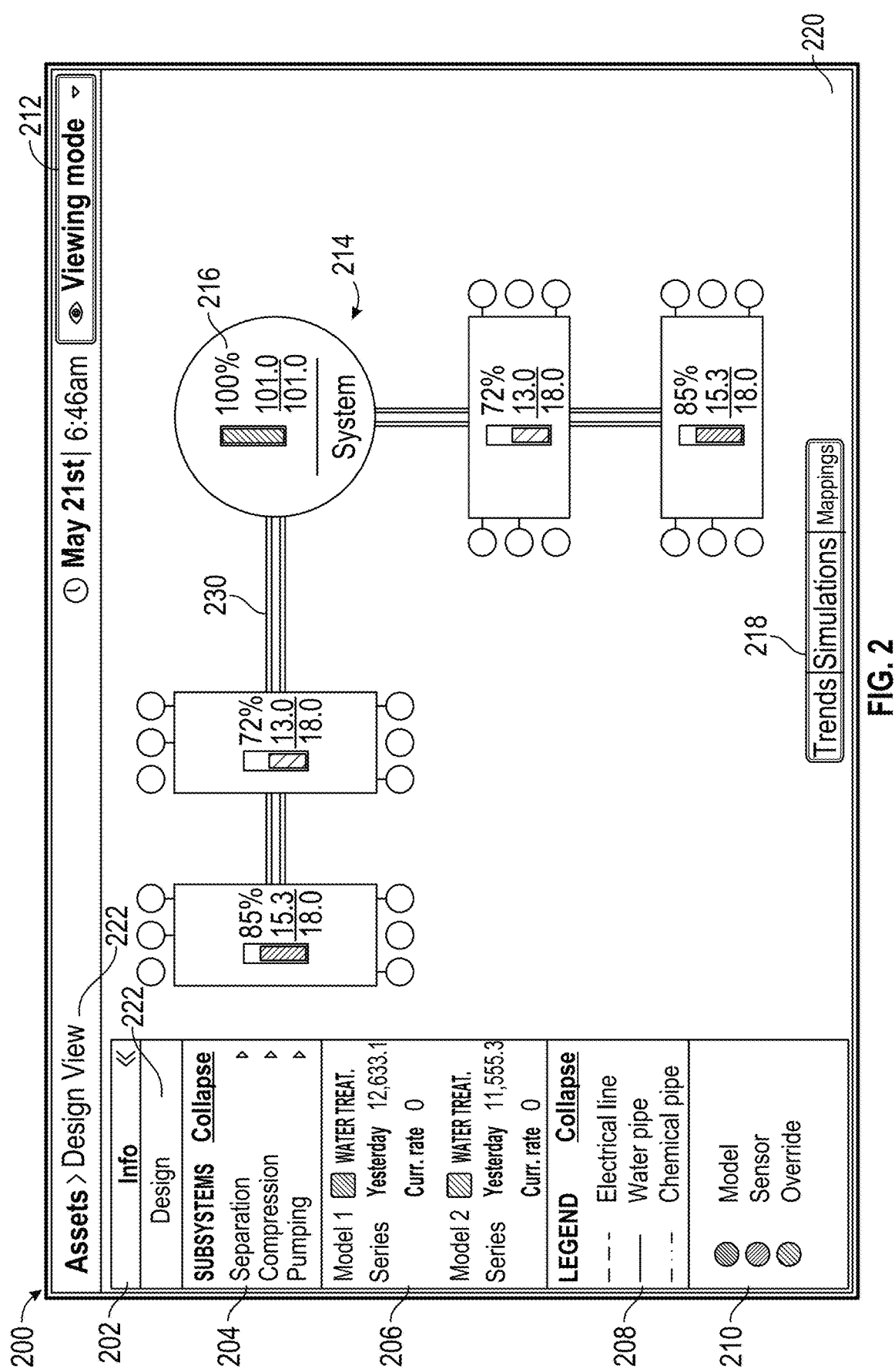
FIG. 2 illustrates a user interface that displays a simulated system representing a real world system.

FIG. 2 illustrates a user interface 200 that displays a high level design view 222 of a simulated technical system 214 representing a technical real world system. In some embodiments, the high level design view 222 depicts an overview of the design of the system 214 (e.g., depicts an overview of the architecture of the system 214 without showing the models 206, technical subsystems 204, and/or technical objects that form the technical system 214) and indicates how the system 214 is performing (e.g., to indicate the health 216 of one or more models 206 of the system 214). The health 216 of one or more models 206 of the technical system 214 may be indicated by the health of each technical object, object property, and/or subsystem 204 of the model(s) 206, as illustrated in the low level system view of FIGS. 3-8. For example, the technical system 214 may comprise a plurality of models 206, subsystems 204, and objects with object properties. A low level system view 340 of the internal structure of the system 214 that displays the plurality of models 206, subsystems 204, and objects with object properties may be illustrated in FIGS. 3-8.

The user interface 200 may include a schematic panel 220. The schematic panel 220 may display and/or allow a user to interact with (e.g., view, edit, move, add, delete, etc.) model specific subsystems, objects, object properties, error detection data, and/or events of the system 214. The schematic panel 220 may include a visible grid and/or pattern over which the model specific subsystems, objects, object properties, error detection data and/or events may be displayed. The schematic panel 220 may also be illustrated in the low level system view 340 of FIGS. 3-8.

Lines 230 in the schematic panel 220 may represent relationships between the model specific subsystems and/or objects of the system 214. An ontology may be created or updated by the model simulator 145 in various ways, including using manual and/or automatic processes as described herein. The model simulator 145 and/or the user interface generator 143 may further convert the ontology into a low-level (e.g., node list) representation. In some implementations, the user interface 200 may allow a user to create (e.g., instruct, via a user device 160, the model simulator 145 to create) and/or interact with the ontology, models, subsystems, and/or objects of the system 214. For example, a user can interact with the objects of the system 214 by placing, dragging, linking, and/or deleting visual entities (e.g., graphical representations of the objects) via the user interface 200. Thus, the user interface 200 can depict model specific object properties, objects, subsystems, and/or links (e.g., relationships) between system 214 components.

The user interface 200 may include an information panel 202 comprising subsystems 204 (e.g., separation, compression and pumping subsystems 204), models 206 (e.g., water treatment models 206), lines/connectors 208 (e.g., electrical line, water pipe, and chemical pipe connectors 208) to various technical objects and/or technical subsystems 204 of the technical system 214, and system indicators 210 (e.g., "model", "sensor" and "override" indicators 210) within the system 214, as illustrated in FIGS. 2-8. In some embodiments, other system indicators 210 may be depicted in the information panel 202, including "healthy," "warning," "unhealthy," "model output," "simulation output," and "sensor reading" indicators. The information panel 202 may further list the current view of the user interface 200 (e.g. high level system design view 222, low level system view 340, etc.).

The user interface 200 may include a mode toggle button 212, which allows a user to switch between an editing mode and a viewing mode. By toggling the mode toggle button 212 to the viewing mode, the user may view the information, schematic, trend, simulation, time, equipment, toolbar, and/or mapping panels. By toggling the mode toggle button 212 to the editing mode, the user may edit the information, schematic, trend, simulation, time, equipment, toolbar, and/or mapping panels.

The user interface 200 may further include a time-visualization toggle 218, which allows a user to view the trends, simulations, and/or mappings panels that depict the results of the simulation of one or more models 206 by the model simulator 145. For example, one of the panels (e.g., trends, simulations and/or mappings panels) may be selected using the time-visualization toggle 218 to display an interactive line graph, simulation table, mapping chart, and/or the like that corresponds to the model specific technical subsystems, technical objects, technical object properties, error detection data, and/or events of the technical system 214, as illustrated in the low level system view 340 of FIGS. 3-8. In some embodiments, the trends panel, the simulations panel, and/or mappings panel may be a singular time-series visualization panel that display the results of the simulation of one or more models 206 by the model simulator 145.

Figure 3:
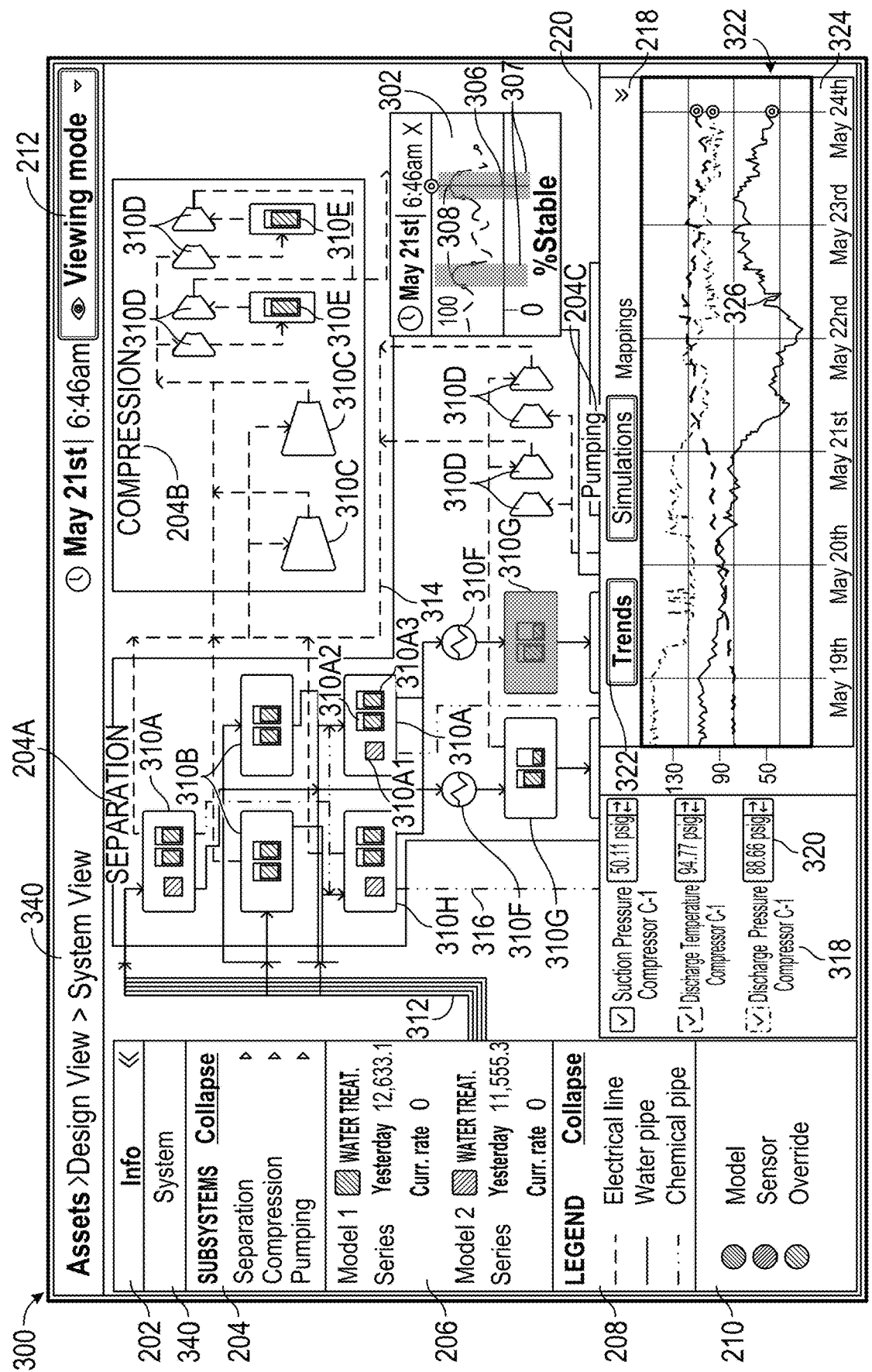
FIG. 3 illustrates a user interface that displays the internal structure of the system with a time slider in viewing mode.

FIG. 3 illustrates a user interface 300 that displays the internal structure of the system 214 with a time slider 306 in the viewing mode. In some embodiments, a low level system view 340 of the system 214 of FIG. 2 is illustrated in FIGS. 3-8 that depicts in the schematic panel 220 the internal components and relationships thereof that form the technical system 214. For example, the internal structure of the technical system 214 may include interactive model specific subsystems 204A-C and objects 310A-H displayed in the schematic panel 220.

For example, the model specific objects 310A-H displayed in the schematic panel 220 may include a compressor 310C, a separator 310D, etc. from the water treatment model 206, and a separation chamber 310B, a pump separator 310H, etc. from the water treatment model 206. Additionally, the model specific technical subsystems 204 listed in the information panel 202 are illustrated individually in the schematic panel 220 as separation subsystem 204A, compression subsystem 204B and pumping subsystem 204C.

In some embodiments, some or all of the subsystems 204A-C depicted in the schematic panel 220 may further include model specific objects 310A-H with object properties that may be specific to the subsystem 204A-C. For example, the compression subsystem 204C includes two compressors 310C. Although the subsystems 204A-C and/or objects 310A-H are model specific, in some embodiments, the subsystems 204A-C and/or objects 310A-H are shared between models. Each subsystem 204A-C and/or object 310A-H may include an input and/or output that may couple to another output and/or input of another subsystem 204A-C and/or object 310A-H. For example, the output of one subsystem 204A-C may couple to the input of another subsystem 204A-C. As an illustrative example, five outputs from the separation subsystem 204A couple to one input of the compression subsystem 204B via water pipe 314 of the water treatment model 206. In particular, the output from two separators 310D, one separation chamber 310B, and two pump separators 310H (e.g., the five outputs from the separation subsystem 204A) couple to the input of two compressors 310C (e.g., the input into the compression subsystem 204B is split into two inputs coupled to each compressor 310C within the subsystem 204B). As shown in the example, the connections between the input and the output of a subsystem 204A-C and/or object 310A-H may be shared, overlap, and/or be a one-to-one connection. The inputs and outputs of the subsystems 204A-C and/or objects 310A-H may represent nodes in which an input node connects to an output node. The complex input and output node connections (e.g., links) may create complex nodal relationships.

Relationships between data objects 310A-H, subsystems 204A-C, and/or models 206 may be stored as links, or in some embodiments, as properties in the simulated system date store 146, where a relationship may be detected between the properties. In some embodiments, the links may be directional. For example, a water pipe link may have a direction associated with the water flow, where one pump object is a distributor of water, and a tank object is the receiver of water.

Time-series line graph 302 may be composed of time-series data (e.g., historical measuring device data, live measuring device data, etc.) stored in the time-series data store 144. A user can move or slide the time slider 306 bi-directionally across a time-series data line on the time-series line graph 302, where the horizontal axis is time (e.g., seconds, minutes, hours, days, weeks, years, etc.) and the vertical axis is a measurement unit of a model specific subsystem 204 or object property (e.g., pressure, velocity, sensor stability, etc.). Objects 310A-H and/or subsystems 204A-C may be represented using various colors that may correspond to a colored time slider 306, colored zones 307 on the time-series line graph 302, and/or specific colored sections of the time-series data line 308. In some embodiments the colors that represent an object 310A-H and/or subsystem 204A-C may change based on the time-series data specific times within the time-series. For example, the separation valve 310G may be colored green at the time of the time slider 306 (e.g., May 21$^{st}$ at 6:46 AM), where the time slider 306, zone 307, and/or line section 308 may also be green and may correlate to periods of time within the time-series in which the separation valve 310G is stable. The separation valve 310G may be colored red, however, at a time indicated by the time slider 306 at which the separation valve 310G is unstable. In some embodiments, the colors of the objects 310A-H, subsystems 204A-C, time slider 306, and/or zones 307 on the time-series line graph 302 and/or of portions of the time-series data line 308 may be individually defined by the user based on the ontology and/or the time-series data. For example, the separation valve 310G may turn red when the valve is less than 10% stable, yellow when the valve is 10-60% stable, and green when the valve is greater than 60% stable. Further, the time slider 306 may turn cyan at less than 10% stability, purple at 10-60% stability, and green at greater than 60% stability. Thus, the styling of the time-series graph 302, subsystems 204A-C, and/or objects 310A-H may depend on the time-series data and/or the ontology upon which the time-series data is based.

In some embodiments, the connectors/lines (e.g., electrical line connector 312, water pipeline connector 314, and/or chemical pipeline connector 316) may have varied widths that may correspond to model specific subsystem 204A-C or object property data and/or time-series data. For example, the electrical line connector 312 width is much wider (e.g., more parallel stacked lines) than the width of any other line connector (e.g., water pipeline connector 314 and/or chemical pipeline connector 316) in the schematic panel 220. The electrical line connector 312 having a wider width may indicate that the flow rate into the water treatment system (e.g., of electricity) represented by the electrical line connector 312 is much faster than any other line or pipeline represented by a connector in the schematic panel 220.

In some embodiments, the models 206, subsystems 204A-C, and/or objects 310A-H may have various gauges to represent various states, health, or other like properties that can be gauged and that may correspond to a model 206, subsystem 204A-C, object 310A-H properties, time-series data, and/or error detection data. For example, the separation valve 310A depicts a health 310A1 of the separation valve 310A corresponding to the second water treatment model 206. The separation valve 310A further depicts a health 310A2 of the separation valve 310A corresponding to the first water treatment model 206. In addition, the separation valve 310A depicts a shelf life 310A3 of the separation valve 310A corresponding to the first water treatment model 206 that indicates a remaining life of the separation valve 310A corresponding to the first water treatment model 206 before repair is necessary. In some embodiments, the gauges may be represented as numerical values (e.g., percentages, measurements, etc.) instead of as graphs or other visual graphics.

In some embodiments, the model specific objects 310A-H and/or subsystems 204A-C displayed on the schematic panel 220 may be virtual (e.g., virtual sensors, virtual measuring devices, virtual subsystems, etc.). More details of virtual objects and/or subsystem generation is described herein.

Figure 4:
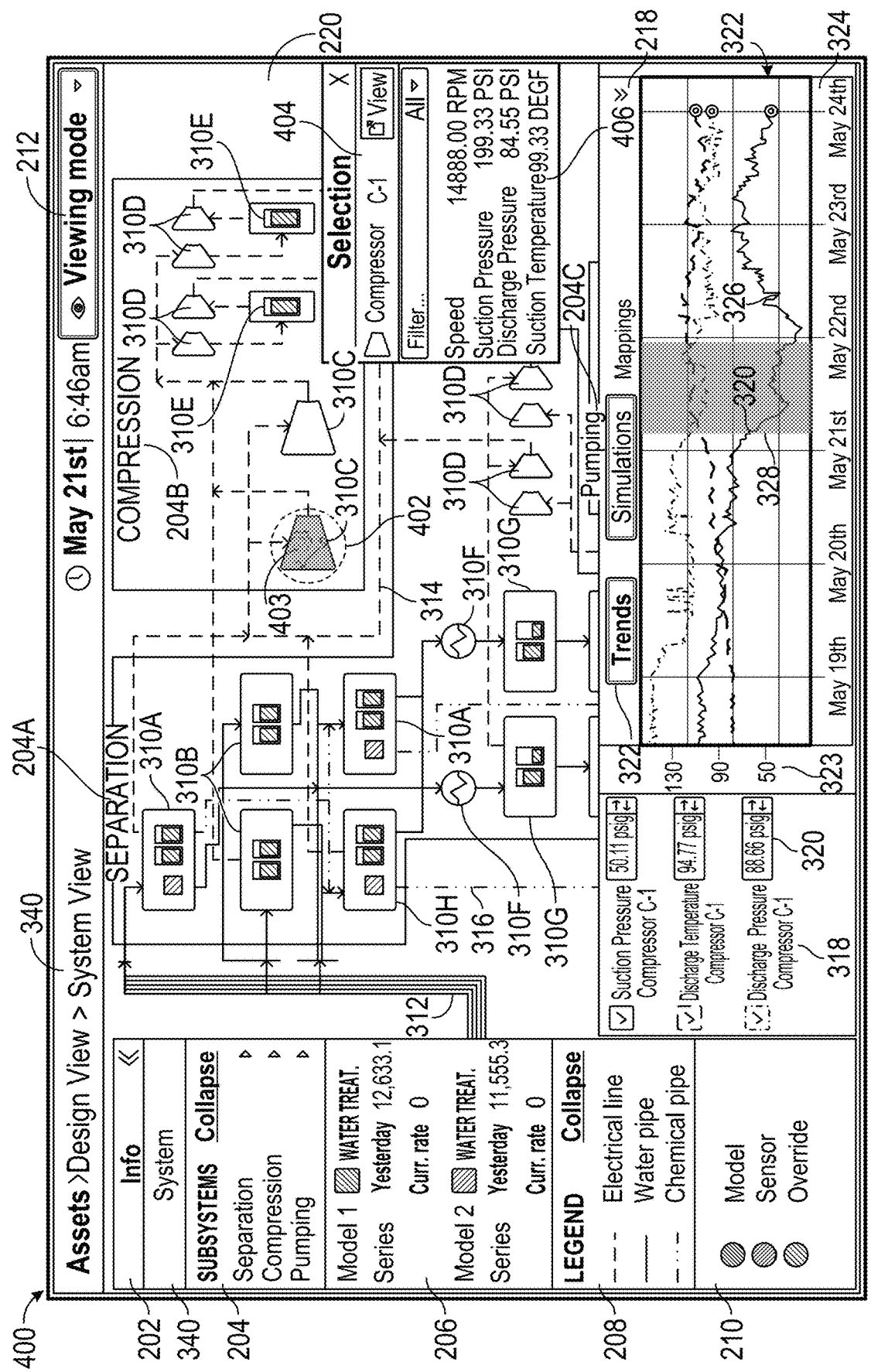
FIG. 4 illustrates a user interface that displays the internal structure of the system with an equipment panel in viewing mode.

FIG. 4 illustrates a user interface 400 that displays the internal structure of the technical system 214 with an equipment panel 404 in the viewing mode. In some embodiments, trends panel 322 may display an interactive graph of historical, live, and/or predicted time-series data (e.g., simulated technical objects 310A-H, technical subsystems 204A-C, and/or technical models 206 within the system 214 for a time-series, with properties and/or attributes associated with each of the simulated technical objects 310A-H, technical subsystems 204A-C, and/or technical models 206 visualized via lines 326 on a time-series line graph depicted in the trends panel 322). The time-series line graph depicted in the trends panel 322 may comprise a first axis representing a varied time duration 324 (e.g., seconds, minutes, hours, days, weeks, years, etc.) and a second axis representing a measurement unit of a model specific subsystem 204A-C or object property 323 (e.g., pressure, temperature, velocity, sensor stability, etc.). The various lines depicted in the time-series line graph may represent various measurement units of a model specific subsystem 204A-C or object 310A-H property over time. For example, the compressor 310C may be selected, as represented by dashed circle 402. As a result, the time-series line graph may display the discharge pressure 318 of the compressor 310C over time. Additionally, the discharge pressure 318 at specific points in time 320 (e.g., 88.66 PSIG) within the time duration 324 may be displayed in the trends panel 322. In some embodiments, the information panel 202 may additionally display some or all of the time-series data.

In some embodiments, the system simulation server 140 (e.g., user interface generator 143, model simulator 145, subsystem simulator 147, and/or object simulator 149) may use the error detection data to further predict and simulate technical objects 310A-H, technical subsystems 204A-C, and/or technical models 206 within the system 214 for a specific time-series or at a specific point in time and/or to visualize properties and/or attributes associated with some or all of the simulated technical objects 310A-H, technical subsystems 204A-C, and/or technical models 206. In some embodiments, the system simulation server 140 (e.g., user interface generator 143, model simulator 145, subsystem simulator 147, and/or object simulator 149) may use artificial intelligence (e.g., machine learning, neural networks such as a recurrent neural network, etc.) to further predict and simulate technical objects 310A-H, technical subsystems 204A-C, and/or technical models 206 within the technical system 214 for a specific time-series or at a specific point in time and/or to visualize properties and or attributes associated with some or all of the simulated technical objects 310A-H, technical subsystems 204A-C, and/or technical models 206.

In some embodiments, a portion 328 of the interactive time-series line graph may change color based on an event associated with a model specific technical object 310A-H and/or technical subsystem 204A-C occurring during the portion 328. For example, the portion 328 can be a range of time during the time duration 324 or a time instant within the time duration 324. The model specific technical object 310A-H and/or technical subsystem 204A-C associated with the event may also change color (e.g., to the same color as the portion 328 or to a different color than the portion 328) and/or be associated with an icon that is displayed in the user interface 400 and that symbolizes the event type. For example, the compressor 310C may be selected, as represented by dashed circle 402, and may be associated with a deferral event (e.g., an event indicating a repair of the associated object has been deferred and/or is scheduled at a future date). As a result, the compressor 310C may be shaded red and/or be associated with a displayed repair icon 403 indicating that the deferral event is occurring in association with the compressor 310C. Similarly, the portion 328 may be shaded red given that the deferral event occurred during the time period represented by the portion 328.

In some embodiments, various model specific time-series line graph lines, technical objects 310A-H, and/or technical subsystems 204A-C may be selected by a user to display an interactive equipment panel 404. For example, the compressor 310C may be selected by a user, which causes the interactive equipment panel 404 to display a list of measurement properties and values 406 (e.g., speed, suction pressure, discharge pressure, and suction pressure) associated with the selected compressor 310C for a specific point in time (e.g., May $21^{st}$ at 6:46 AM) or a specific range of time.

Figure 5:
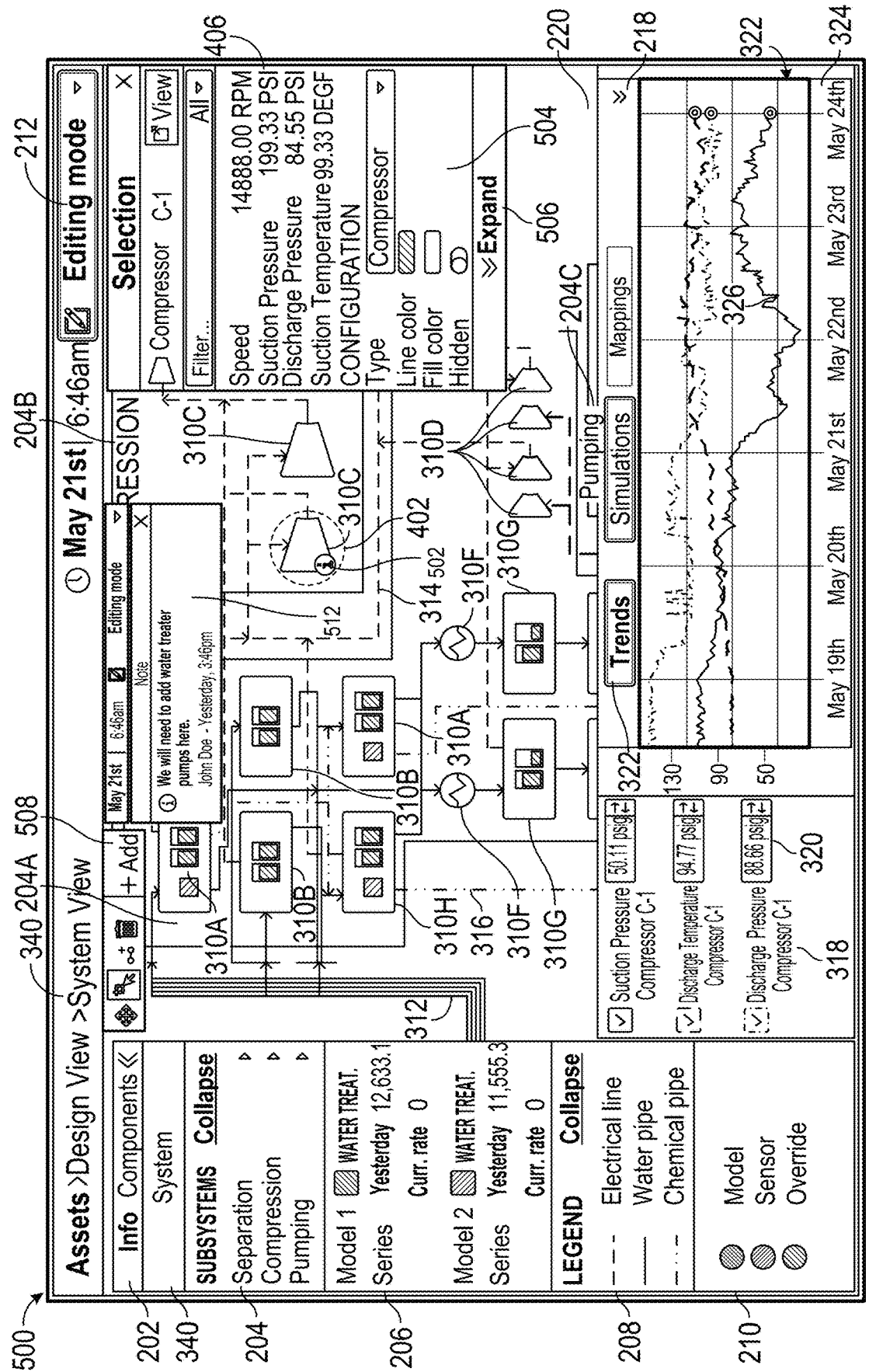
FIG. 5 illustrates a user interface that displays the internal structure of the system with annotations in editing mode.

FIG. 5 illustrates a user interface 500 that displays the internal structure of the technical system 214 with annotations 502 in the editing mode. In some embodiments, the equipment panel 404 may transition into an object and property type editor panel 504 when a user of the technical system 214 uses the mode toggle button 212 to select the editing mode. The user can use the object and property type editor panel 504 to create and/or modify the type of a technical object 310A-H (e.g., modify the compressor 310C into a different type of object 310A-H) and/or one or more technical properties of a technical object 310A-H (e.g., set the speed, suction pressure, discharge pressure, suction temperature, etc. of a technical object 310A-H).

In some embodiments, the user interface 500 further depicts a toolbar panel 508. A user can use the toolbar panel 508 as a schematic editor to add, delete, move, and/or edit links, model specific technical objects 310A-H, and/or technical subsystems 204A-C within the schematic panel 220. Alternatively or in addition, other programs, processes, or programmatic controls (e.g., artificial intelligence, model simulator 145, subsystem simulator 147, and/or object simulator 149) may modify, define, add, delete, move, and/or edit property types, attributes, links, model specific objects 310A-H, and/or technical subsystems 204A-C without user interaction with the toolbar panel 508. In some embodiments, the object and property type editor panel 504 contracts via expand button 506 to a minimum height (e.g., such that the object and property type editor panel 504 partially covers the length of the schematic panel 220) or expands via the expand button 506 to a maximum size (e.g., such that the object and property type editor panel 504 covers the entire length of the schematic panel 220). In the expanded view, the object and property type editor panel 504 may list additional measurement properties and/or values associated with the selected technical object 310A-H and/or technical subsystem 204A-C.

In some embodiments, the user may annotate the schematic panel 220. For example, the user can select an option in the user interface 500 (not shown) that allows the user to note, markup, or otherwise annotate any portion of the user interface 500 with one or more annotations 502. In some embodiments, an annotation 502 may be associated with and/or placed on model specific technical objects 310A-H and/or technical subsystems 204A-C, with an icon denoting that the model specific technical object 310A-H and/or technical subsystem 204A-C has been annotated. For example, the compressor 310C is associated with an annotation 502 denoted by an icon. Information associated with the annotation 502 may be displayed in the user interface 500 in panel 512. For example, the panel 512 indicates that that the compressor 310C has been annotated by John Doe to indicate that a water treater pump should be added as an input to the compressor 310C at a location denoted by the location of the annotation 502 icon.

Figure 6:
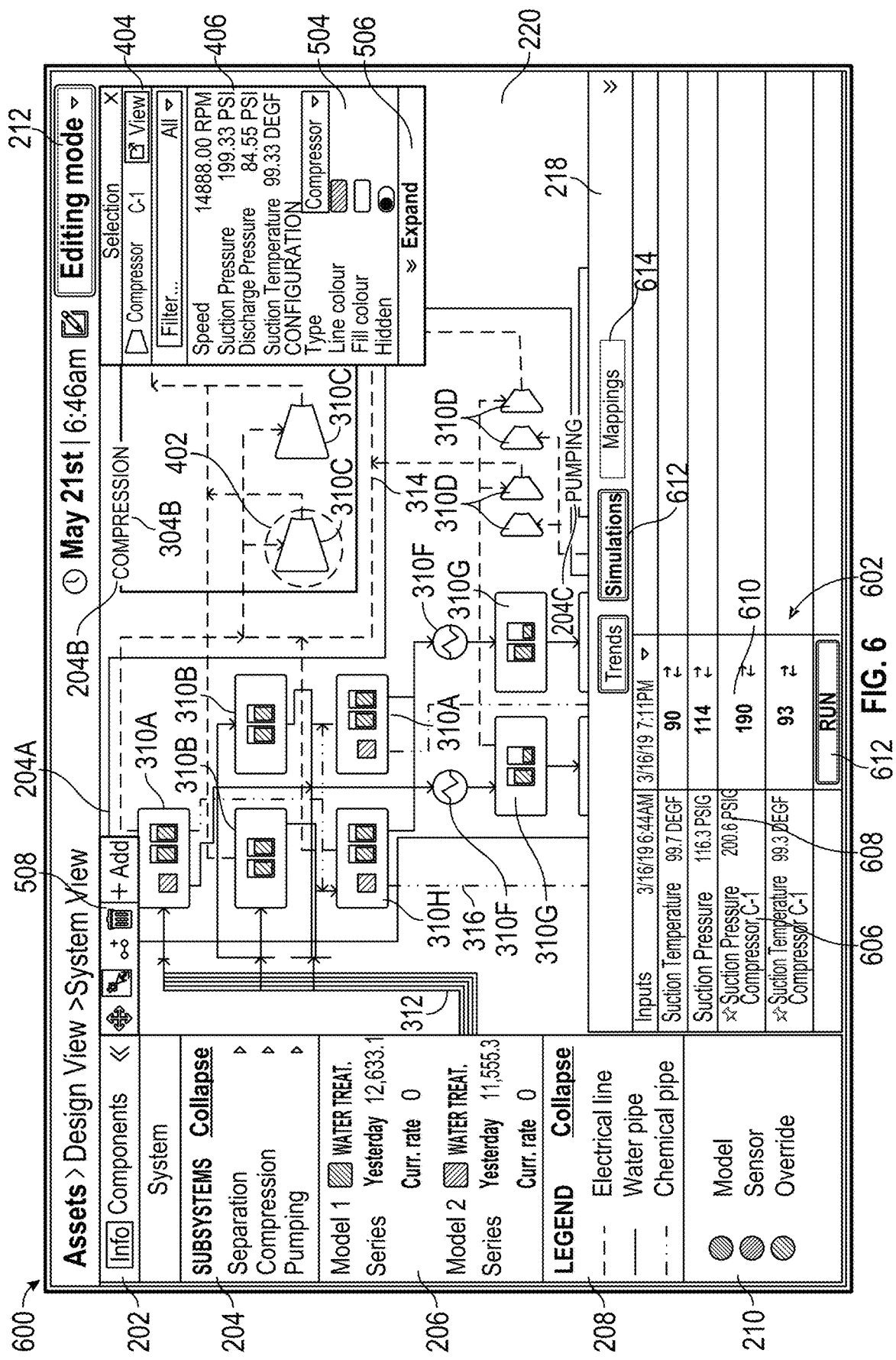
FIG. 6 illustrates a user interface that displays the internal structure of the system with a simulations panel in editing mode.

FIG. 6 illustrates a user interface 600 that displays the internal structure of the technical system 214 with a simulations panel 602 in the editing mode 212. In some embodiments, the simulations panel 602 may allow the user to simulate technical objects 310A-H, technical subsystems 204A-C and/or technical models 206 (e.g., via object simulator 149, subsystem simulator 147, and/or model simulator 145) within the system 214 for a specific period of time or at a specific point in time and/or to view properties and/or attributes associated with some or all of the simulated objects 310A-H, subsystems 204A-C, and/or models 206. For example, a compressor object 310C may be selected by the user, as shown by dashed circle 402, and simulations button 612 may be selected, which causes the simulations panel 602 to be displayed in the user interface 600. The starting suction pressure of the compressor object 310C may be set to 200.6 PSI 608 at 6:44 AM on Mar. 16, 2019 for the simulation. The current suction pressure of the compressor object 310C may be 199.33 PSI 406 at 6:46 AM on May 21, 2019. The compressor object 310C may then be simulated via button 612, resulting in a simulated suction pressure of the compressor object 310C being 190 PSI 160 at 7:11 PM on Mar. 16, 2019. In some embodiments, the system simulation server 140 (e.g., user interface generator 143, model simulator 145, subsystem simulator 147 and object simulator 149) may use the error detection data to further simulate technical objects 310A-H, technical subsystems 204A-C, and/or technical models 206 within the technical system 214 for a specific period of time or at a specific point in time and/or to visualize properties and/or attributes associated with some or all of the simulated technical objects 310A-H, technical subsystems 204A-C, and/or technical models 206.

In some embodiments, mappings button 614, when selected, may cause a mappings panel to be displayed. The mappings panel may depict a list and/or digraph of predicted and/or current technical object 310A-H, technical subsystem 204A-C, and/or technical model 206 relationships (e.g., current and/or predicted input and/or output node relationships) that may be determined by an ontology and/or artificial intelligence (e.g., a recurrent neural network).

Figure 7:
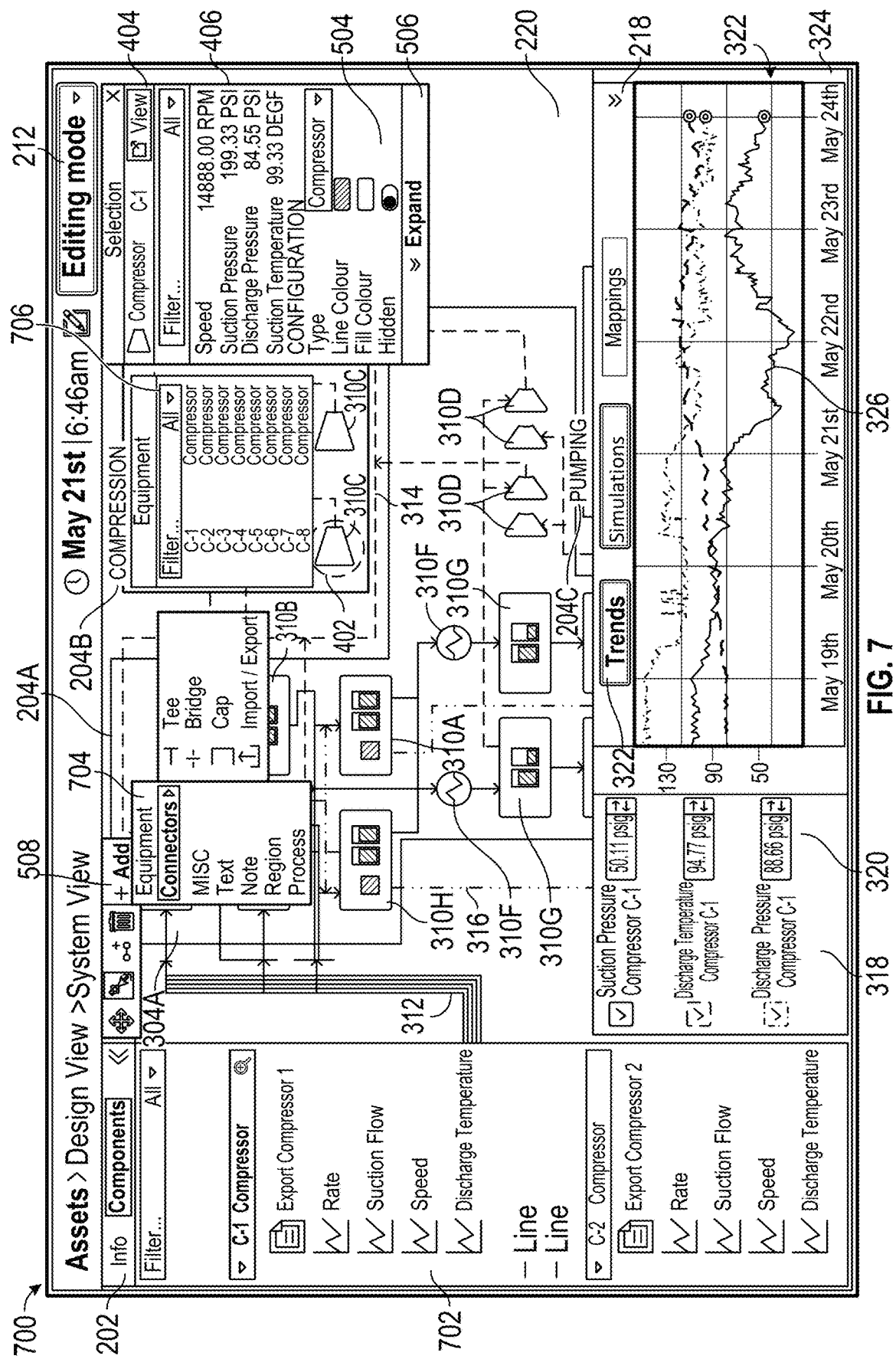
FIG. 7 illustrates a user interface that displays the internal structure of the system with a toolbar panel in editing mode.

FIG. 7 illustrates a user interface 700 that displays the internal structure of the technical system 214 with a toolbar panel 508 in the editing mode. The toolbar panel 508 may act as a schematic editor that allows a user to add, delete, move, and/or edit links, model specific objects 310A-H, and/or technical subsystems 204A-C within the schematic panel 220. In some embodiments, the user, via selection of the toolbar panel 508 and add equipment item 704, can display an additional interactive equipment panel 706. The additional interactive equipment panel 706 may enable the user to swap out selected model specific technical subsystems 204A-C and/or technical objects 310A-H for new model specific technical subsystems 204A-C and/or objects 310A-H. In some embodiments, the new model specific technical subsystems 204A-C and/or technical objects 310A-H may also include virtual technical subsystems and/or virtual technical objects.

Figure 8:
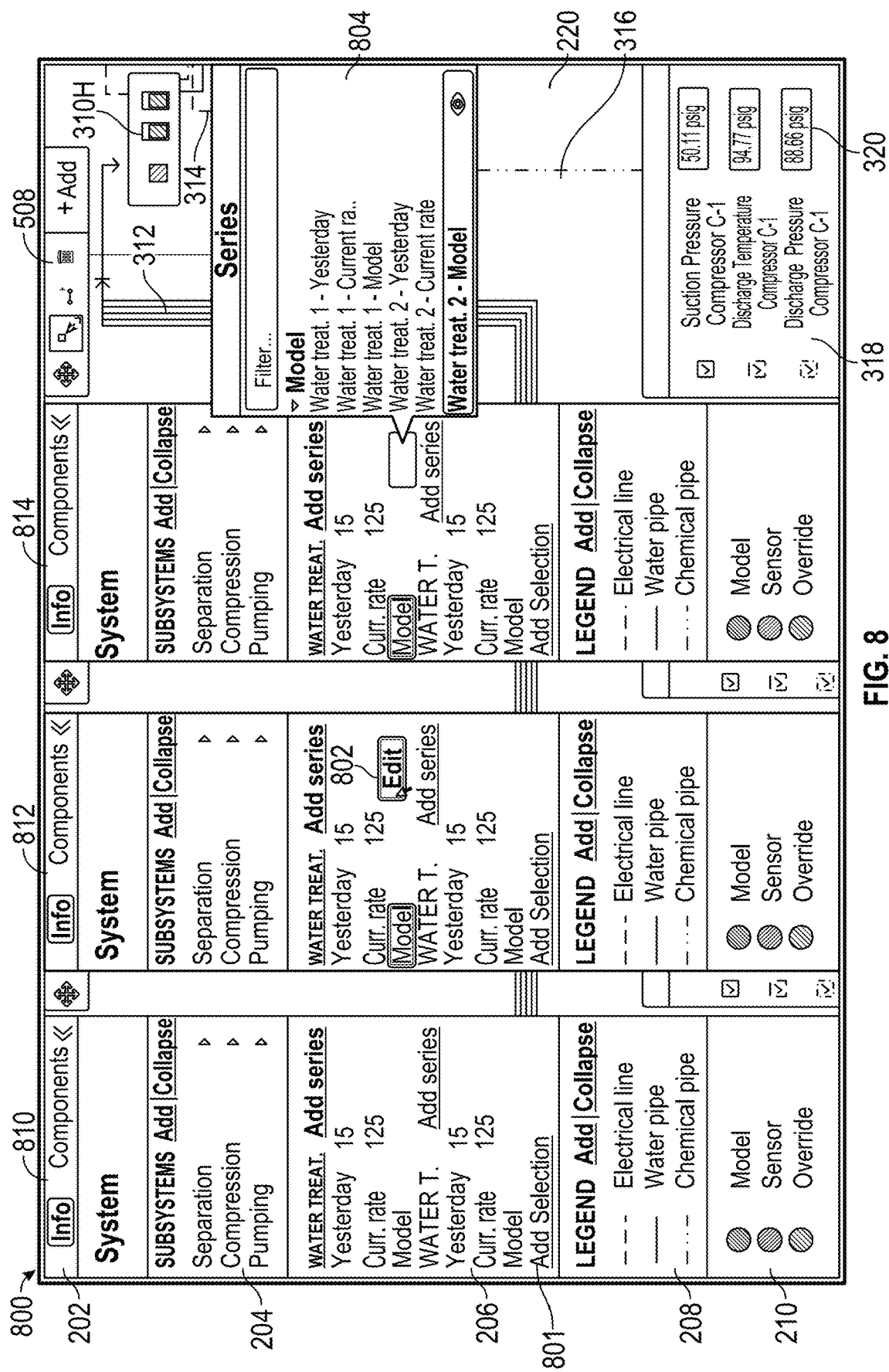
FIG. 8 illustrates a series of the same user interface which displays an information panel being edited in editing mode of the internal structure of the system.

FIG. 8 illustrates panels 810, 812, and 814 in a user interface 800 that depict a process for editing a technical system 214 in the editing mode. In some embodiments, current models 206 may be swapped out (e.g., via edit button 802) for other models 804 (e.g., new models, same models but from a different time-series, same models but with different rates, same models but with a different health, etc.). In some embodiments, new models and/or the same models may be added via button 801 (e.g., new models, same models but from a different time-series, same models but with different rates, same models but with a different health, etc.). In this way, a user can select specific models to insert into the system 214. A model that a user replaces with another model or adds to the system 214 can be a black box model, a known or transparent model, and/or any combination thereof.

Exemplary Process for Visualizing and Interacting with Models in a GUI

Figure 9:
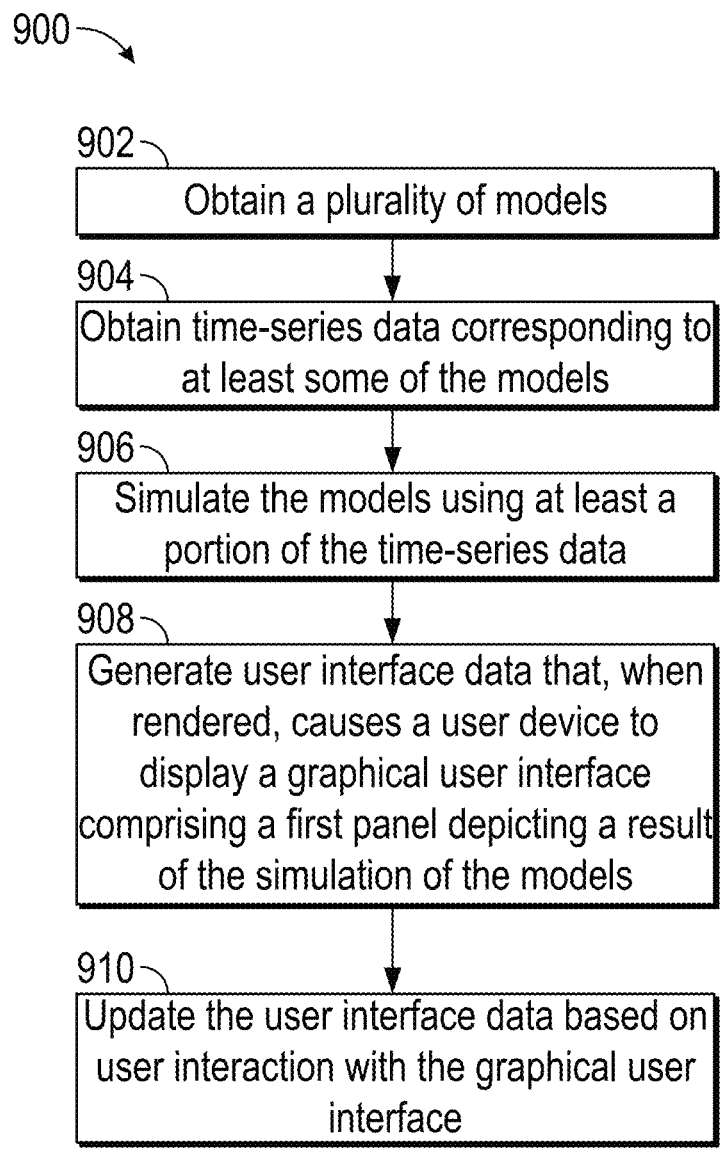
FIG. 9 is a flowchart illustrating a process for visualizing and interacting with the plurality of models depicted in the graphical user interface.

FIG. 9 is a flowchart 900 illustrating a process for visualizing and interacting with the plurality of models depicted in the graphical user interface. The process 900 may be implemented by the system simulation server 140 (e.g., the user interface generator 143, the model simulator 145, the subsystem simulator 147, and/or the object simulator 149) of FIG. 1.

At block 902, a plurality of models is obtained. The models may be obtained by the model simulator 145 illustrated in FIG. 1.

At block 904, time-series data corresponding to at least some of the models is obtained (e.g., historical model data, live model data, predicted model data, error detection data, event data, etc.). Furthermore, the time-series data corresponding to a model may relate to model specific subsystems, objects, and/or object properties (e.g., property types and/or property values).

At block 906, the models may be simulated using at least a portion of the time-series data. For example, the model simulator 145 may simulate some or all of the models in the plurality using the time-series data.

At block 908, user interface data is generated that, when rendered by a user device, causes the user device to display a graphical user interface comprising a first panel depicting a result of the simulation of some or all of the models. The first panel can be an information panel, a trend panel, a simulation panel, a mapping panel, a schematic panel, a time panel, an equipment panel, a toolbar panel, and/or the like. The first panel may be associated with the simulated models 206, objects 310A-H, and/or subsystems 204A-C. The user interface data can be transmitted to the user device (e.g., by the user interface generator 143).

At block 910, the user interface data is updated based on user interaction with the graphical user interface. Updating the user interface data may cause the graphical user interface rendered by a user device to show a result of the user interaction. A user interaction with the graphical user interface can include moving the time slider 308 of FIG. 3, using the toolbar 508 to remove a compressor object 310C, as illustrated in FIG. 6, selecting the compressor object 310C to bring up the selection panel 404, as illustrated in FIG. 6, etc.

Additional Implementation Details and Embodiments

Various embodiments of the present disclosure may be a system, a method, and/or a computer program product at any possible technical detail level of integration. The computer program product may include a computer readable storage medium (or mediums) having computer readable program instructions thereon for causing a processor to carry out aspects of the present disclosure.

For example, the functionality described herein may be performed as software instructions are executed by, and/or in response to software instructions being executed by, one or more hardware processors and/or any other suitable computing devices. The software instructions and/or other executable code may be read from a computer readable storage medium (or mediums).

The computer readable storage medium can be a tangible device that can retain and store data and/or instructions for use by an instruction execution device. The computer readable storage medium may be, for example, but is not limited to, an electronic storage device (including any volatile and/or non-volatile electronic storage devices), a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a solid state drive, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions (as also referred to herein as, for example, "code," "instructions," "module," "application," "software application," and/or the like) for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Java, C++, and/or the like, and procedural programming languages, such as the "C" programming language or similar programming languages. Computer readable program instructions may be callable from other instructions or from itself, and/or may be invoked in response to detected events or interrupts. Computer readable program instructions configured for execution on computing devices may be provided on a computer readable storage medium, and/or as a digital download (and may be originally stored in a compressed or installable format that requires installation, decompression or decryption prior to execution) that may then be stored on a computer readable storage medium. Such computer readable program instructions may be stored, partially or fully, on a memory device (e.g., a computer readable storage medium) of the executing computing device, for execution by the computing device. The computer readable program instructions may execute entirely on a user's computer (e.g., the executing computing device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart(s) and/or block diagram(s) block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. For example, the instructions may initially be carried on a magnetic disk or solid state drive of a remote computer. The remote computer may load the instructions and/or modules into its dynamic memory and send the instructions over a telephone, cable, or optical line using a modem. A modem local to a server computing system may receive the data on the telephone/cable/optical line and use a converter device including the appropriate circuitry to place the data on a bus. The bus may carry the data to a memory, from which a processor may retrieve and execute the instructions. The instructions received by the memory may optionally be stored on a storage device (e.g., a solid state drive) either before or after execution by the computer processor.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. In addition, certain blocks may be omitted in some implementations. The methods and processes described herein are also not limited to any particular sequence, and the blocks or states relating thereto can be performed in other sequences that are appropriate.

It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. For example, any of the processes, methods, algorithms, elements, blocks, applications, or other functionality (or portions of functionality) described in the preceding sections may be embodied in, and/or fully or partially automated via, electronic hardware such application-specific processors (e.g., application-specific integrated circuits (ASICs)), programmable processors (e.g., field programmable gate arrays (FPGAs)), application-specific circuitry, and/or the like (any of which may also combine custom hard-wired logic, logic circuits, ASICs, FPGAs, etc. with custom programming/execution of software instructions to accomplish the techniques).

Any of the above-mentioned processors, and/or devices incorporating any of the above-mentioned processors, may be referred to herein as, for example, "computers," "computer devices," "computing devices," "hardware computing devices," "hardware processors," "processing units," and/or the like. Computing devices of the above-embodiments may generally (but not necessarily) be controlled and/or coordinated by operating system software, such as Mac OS, iOS, Android, Chrome OS, Windows OS (e.g., Windows XP, Windows Vista, Windows 7, Windows 8, Windows 10, Windows Server, etc.), Windows CE, Unix, Linux, SunOS, Solaris, Blackberry OS, VxWorks, or other suitable operating systems. In other embodiments, the computing devices may be controlled by a proprietary operating system. Conventional operating systems control and schedule computer processes for execution, perform memory management, provide file system, networking, I/O services, and provide a user interface functionality, such as a graphical user interface ("GUI"), among other things.

Figure 10:
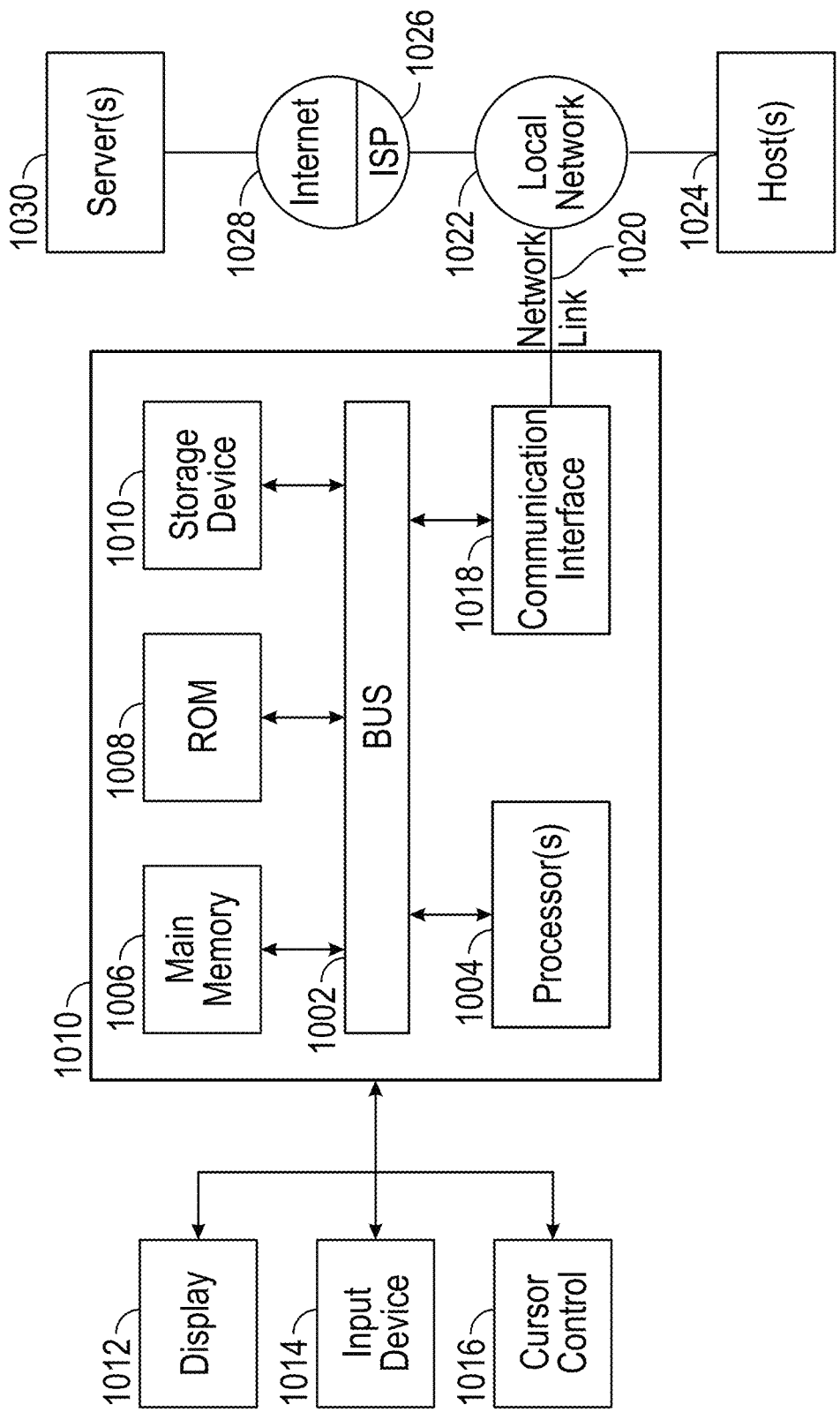
FIG. 10 is a block diagram that illustrates a computer system upon which various embodiments may be implemented.

For example, FIG. 10 is a block diagram that illustrates a computer system 1000 upon which various embodiments may be implemented. Computer system 1000 includes a bus 1002 or other communication mechanism for communicating information, and a hardware processor, or multiple processors, 1004 coupled with bus 1002 for processing information. Hardware processor(s) 1004 may be, for example, one or more general purpose microprocessors.

Computer system 1000 also includes a main memory 1006, such as a random access memory (RAM), cache and/or other dynamic storage devices, coupled to bus 1002 for storing information and instructions to be executed by processor 1004. Main memory 1006 also may be used for storing temporary variables or other intermediate information during execution of instructions to be executed by processor 1004. Such instructions, when stored in storage media accessible to processor 1004, render computer system 1000 into a special-purpose machine that is customized to perform the operations specified in the instructions.

Computer system 1000 further includes a read only memory (ROM) 1008 or other static storage device coupled to bus 1002 for storing static information and instructions for processor 1004. A storage device 1010, such as a magnetic disk, optical disk, or USB thumb drive (Flash drive), etc., is provided and coupled to bus 1002 for storing information and instructions.

Computer system 1000 may be coupled via bus 1002 to a display 1012, such as a cathode ray tube (CRT) or LCD display (or touch screen), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor. Other kinds of devices may be used to provide for interaction with a user as well. For example, feedback provided to the user may be any form of sensory feedback, such as for example visual feedback, auditory feedback, or tactile feedback; and input from the user may be received in any form, including acoustic, speech, or tactile input. Other possible input devices include touch screens or other touch-sensitive devices such as single or multi-point resistive or capacitive trackpads, voice recognition hardware and software, optical scanners, optical pointers, digital image capture devices and associated interpretation software, and the like.

Computing system 1000 may include a user interface module to implement a GUI that may be stored in a mass storage device as computer executable program instructions that are executed by the computing device(s). Computer system 1000 may further, as described below, implement the techniques described herein using customized hard-wired logic, one or more ASICs or FPGAs, firmware and/or program logic which in combination with the computer system causes or programs computer system 1000 to be a special-purpose machine. According to one embodiment, the techniques herein are performed by computer system 1000 in response to processor(s) 1004 executing one or more sequences of one or more computer readable program instructions contained in main memory 1006. Such instructions may be read into main memory 1006 from another storage medium, such as storage device 1010. Execution of the sequences of instructions contained in main memory 1006 causes processor(s) 1004 to perform the process steps described herein. In alternative embodiments, hard-wired circuitry may be used in place of or in combination with software instructions.

Various forms of computer readable storage media may be involved in carrying one or more sequences of one or more computer readable program instructions to processor 1004 for execution. For example, the instructions may initially be carried on a magnetic disk or solid state drive of a remote computer. The remote computer can load the instructions into its dynamic memory and send the instructions over a telephone line using a modem. A modem local to computer system 1000 can receive the data on the telephone line and use an infra-red transmitter to convert the data to an infra-red signal. An infra-red detector can receive the data carried in the infra-red signal and appropriate circuitry can place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card, cable modem, satellite modem, or a modem to provide a data communication connection to a corresponding type of telephone line. As another example, communication interface 1018 may be a local area network (LAN) card to provide a data communication connection to a compatible LAN (or WAN component to communicate with a WAN). Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are example forms of transmission media.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018.

The received code may be executed by processor 1004 as it is received, and/or stored in storage device 1010, or other non-volatile storage for later execution.

As described above, in various embodiments certain functionality may be accessible by a user through a web-based viewer (such as a web browser), or other suitable software program). In such implementations, the user interface may be generated by a server computing system and transmitted to a web browser of the user (e.g., running on the user's computing system). Alternatively, data (e.g., user interface data) necessary for generating the user interface may be provided by the server computing system to the browser, where the user interface may be generated (e.g., the user interface data may be executed by a browser accessing a web service and may be configured to render the user interfaces based on the user interface data). The user may then interact with the user interface through the web-browser. User interfaces of certain implementations may be accessible through one or more dedicated software applications. In certain embodiments, one or more of the computing devices and/or systems of the disclosure may include mobile computing devices, and user interfaces may be accessible through such mobile computing devices (for example, smartphones and/or tablets).

These computer programs, which may also be referred to as programs, software, software applications, applications, components, or code, may include machine instructions for a programmable controller, processor, microprocessor or other computing or computerized architecture, and may be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium may store such machine instructions non-transitorily, such as for example as would a non-transient solid-state memory or a magnetic hard drive or any equivalent storage medium. The machine-readable medium may alternatively or additionally store such machine instructions in a transient manner, such as for example as would a processor cache or other random access memory associated with one or more physical processor cores.

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

The systems, methods, and devices described herein each have several aspects, no single one of which is solely responsible for its desirable attributes. Without limiting the scope of this disclosure, several non-limiting features will now be discussed briefly. The following paragraphs describe various example implementations of the devices, systems, and methods described herein. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In some embodiments, the technical objects may comprise physical or virtual measuring devices or sensors coupled to physical or virtual technical items or products, pumps, machinery, welding stations, vats, containers, compressors, fans, turbines, blowers, air conditioning systems, heating systems, noise and attenuation systems, ventilation systems, hydraulic systems, pneumatic systems, actuators, fasteners, threads, piping systems, valves, beams, columns, cables, nozzles, semiconductor devices, motors, transformers, electrical components, wires, generators, nuclear reactors, items or products, organizations, countries, counties, factories, customers, hospitals, or other objects relevant to the pertaining model.

In some embodiments, the one or more object properties may be numerical, physical, geometrical, inferred, real, simulated, or virtual. Further the object properties may comprise of logical computations related to order volume, sales amounts, sales quantity during a time period (e.g., a day, a week, a year, etc.), population density, patient volume, or other object properties relevant to the pertaining model. Alternatively or in addition, the technical object properties may comprise of measurements related to temperature, pressure, flow rate, capacity, time, length, mass, electric current, amount of substance, luminous intensity, plane angle, solid angle, frequency, energy, power, charge, voltage, capacitance, resistance, conductance, flux, inductance, radioactivity, dose, catalytic activity, area, volume, speed, acceleration, density, or other object properties relevant to the pertaining model.

In some embodiments, the data resulting from the simulation of multiple models may comprise of historical object data, historical object property data, live object data, live object property data, predicted object data and predicted object property data.

In some embodiments, the given period of time the trend panel displays for one or more object properties of an object may comprise of seconds, minutes, hours, days, weeks, or years.

In some embodiments, the state of a technical object may comprise of open, closed, running above specification, running below specification, in repair, broken, or other like status indicators relevant to the pertaining model.

In some embodiments, the events that occurred in association with a technical object may comprise weather events, maintenance events, or other like events relevant to the pertaining model.

Another aspect of the disclosure provides a computer-implemented method for visualizing and interacting with a plurality of models depicted in a graphical user interface, the computer-implemented method comprising by one or more processors executing program instructions: obtaining the plurality of models, wherein the plurality of models may comprise a first model and a second model; obtaining first time-series data corresponding to the first model and second time-series data corresponding to the second model simulating the first and second models using at least a portion of the first time-series data or the second time-series data; and generating user interface data that, when rendered by a user device, causes the user device to display a graphical user interface comprising a first panel, wherein the first panel depicts a result of the simulation of the first and second models, wherein the method is performed using one or more processors.

In some embodiments, the plurality of models may not be necessary and a singular model may be used. Time-series data corresponding to the singular model is obtained and simulation of the singular model using at least a portion of the time-series data is used to generate the user interface comprising a panel depicting the result of the simulation. Further, in some other embodiments more than two models may make up the plurality of models.

In some embodiments, the graphical user interface may further comprise a second panel depicting a plurality of objects corresponding to the first model. Further, in some other embodiments more than two panels may depict the plurality of objects corresponding to the first model.

In some embodiments, the plurality of technical objects may comprise a first technical object that is depicted in the second panel in association with a first color to indicate a state of the first object. Further, in some other embodiments one or more technical objects may be depicted in the second panel each with a color to indicate the state of each technical object. Moreover, there may be duplicate technical objects with the same color and state depicted in the second panel.

In some embodiments, the plurality of technical objects may comprise a first technical object wherein a width of a line coupled to the first object in the second panel represents a value of a technical object property of the first object. Further, the width of a line may be coupled to any other technical object of the plurality of technical objects that exists in the second panel to represent a value of a technical object property of the first technical object.

In some embodiments, the plurality of technical objects may comprise a first technical object, wherein the second panel may further depict an indication of an event such as weather events, maintenance events, or other like events relevant to the pertaining model associated with the first technical object. Moreover, this event indication may occur for any other technical object of the plurality of technical objects that exists in the second panel.

In some embodiments, the second panel may depict a schematic of the plurality of technical objects. The schematic of the plurality of technical objects may have at least one of an input and output which connects to at least one of the other technical objects of the plurality of technical objects. For example, the output of a compressor may connect into the input of a water pipe.

In some embodiments, the second panel may depict a schematic of technical subsystems related to the singular model or plurality of models used. For example, if the models used were for water treatment, then some related technical subsystems for those models may be pumping, compression, and separation. Further the technical subsystems may comprise a plurality of technical objects corresponding to the models. For example, a compression subsystem may comprise compressors and pipes which correspond to the water treatment model. The plurality of technical objects may have at least one of an input and output which connects to at least one of the other objects of the plurality of objects. For example, the output of the compressor may connect into the input of a water pipe. Moreover, the plurality of technical objects that comprise each technical subsystem may connect to other technical objects in other technical subsystems and are thus not connection limited by only technical objects of the same technical subsystem or model.

In some embodiments, the first panel may further depict a second result of a second simulation of the first and second models. Further, in some other embodiments more than two results may be depicted on the first panel resulting from one or more simulations of one or more models.

In some embodiments, the first panel may depict the result and the second result as a time-series graph. Further, in some other embodiments more than two results may be depicted on the first panel as a time-series graph.

In some embodiments, the first panel may depict the simulated or user made object connections of the second panel in a mapping chart. In some embodiments, the first panel may further depict the simulated or user made object connections of one or more subsystems of the second panel in a mapping chart.

In some embodiments, the graphical user interface further comprises a second panel depicting a first object corresponding to the first model and an indication of an event associated with the first object, and one or more portions of the time-series graph changes color based on the indication of the event.

In some embodiments, one or more portions of a time-series data line of the time-series graph changes color based on a status of a technical object property of a technical object of the first model.

In some embodiments, one or more models may be one of a known or black box system. For example, a known model may comprise subsystems, objects and object properties that are known to the user or if the model does not comprise subsystems then all objects and object properties are known to the user, whereas a black box system model may comprise at least one unknown subsystem, object or object property.

In some embodiments, the graphical user interface may further comprise a time slider. A third panel may depict a time layer comprising the time slider. The time slider may change color based on a status of an object property of an object of a model.

In some embodiments, the graphical user interface may further comprise receiving an indication of a request to note or markup the graphical user interface with one or more annotations.

In some embodiments, the graphical user interface may further comprise a fourth panel depicting an information layer. The information layer may allow the user to add, delete, edit or view subsystem, model, legend, object and object property information.

In some embodiments, the graphical user interface may further comprise a fifth panel depicting an equipment layer. The equipment layer may allow the user to add, delete, edit or view objects and object properties.

In some embodiments, the graphical user interface may further comprise a sixth panel depicting a toolbar layer. The toolbar layer may allow the user to select, move, add, delete, or chain/link objects and object properties.

Another aspect of the disclosure provides a system for visualizing and interacting with a plurality of models depicted in a graphical user interface, the system comprising: one or more non-transitory computer readable storage mediums storing program instructions; and one or more processors configured to execute the program instructions, wherein the program instructions, when executed by the one or more processors, cause the system to: obtain the plurality of models, wherein the plurality of models comprises a first model and a second model; obtain first time-series data corresponding to the first model and second time-series data corresponding to the second model simulate the first and second models using at least a portion of the first time-series data or the second time-series data; and generate user interface data that, when rendered by a user device, causes the user device to display a graphical user interface comprising a first panel, wherein the first panel depicts a result of the simulation of the first and second models.

Another aspect of the disclosure provides non-transitory, computer-readable storage media comprising computer-executable instructions for visualizing and interacting with a plurality of models depicted in a graphical user interface, wherein the computer-executable instructions, when executed by a computer system, cause the computer system to: obtain the plurality of models, wherein the plurality of models comprises a first model and a second model; obtain first time-series data corresponding to the first model and second time-series data corresponding to the second model simulate the first and second models using at least a portion of the first time-series data or the second time-series data; and generate user interface data that, when rendered by a user device, causes the user device to display a graphical user interface comprising a first panel, wherein the first panel depicts a result of the simulation of the first and second models.

In some embodiments, an alert and/or notification is automatically transmitted to the user device operated by the entity associated with the alert and/or notification from the system (e.g. system simulation server and/or physical or logical system). The alert and/or notification can be transmitted at the time that the alert and/or notification is generated or at some determined time after generation of the alert and/or notification. When received by the user device, the alert and/or notification can cause the user device to display the alert and/or notification via the activation of an application on the user device (e.g., a browser, a mobile application, etc.). For example, receipt of the alert and/or notification may automatically activate an application on the user device, such as a messaging application (e.g., SMS or MMS messaging application), a standalone application (e.g., a data analysis application), or a browser, for example, and display information included in the alert and/or notification. If the user device is offline when the alert and/or notification is transmitted, the application may be automatically activated when the user device is online such that the alert and/or notification is displayed. As another example, receipt of the alert and/or notification may cause a browser to open and be redirected to a login page so that the entity can log and view the alert and/or notification. Alternatively, the alert and/or notification may include a URL of a webpage (or other online information) associated with the alert and/or notification, such that when the user device (e.g., a mobile device) receives the alert, a browser (or other application) is automatically activated and the URL included in the alert and/or notification is accessed via the Internet.

As noted above, implementations of the described examples provided above may include hardware, a method or process, and/or computer software on a computer-accessible medium.

Aspects of the present disclosure are described herein with reference to Application Programming Interfaces (APIs). Various third-parties operate electronic services systems which in some instances, these systems may allow access through APIs. Typically, each API requires its own set of information about a data object, such as name, age, and height for a data object representing a person. Advantageously, embodiments of the present disclosure may collect information related to a data object, form API requests in the format and containing the information required by the API of each third-party ("third-party format"), collect responses from the API of each third-party, translate the different results back into a uniform format that facilitates comparison, storage and/or processing ("common format"), and show the results to the user. For example, different third-parties may require different types of information, and in different format; for example, third-party A may require a data object's name and age properties, whereas third-party B may require an data object's age and height properties but not name.

Advantageously, rather than presenting the user with different third-parties' requests to provide different information repeatedly, the system may retrieve the required information from its database and automatically convert it into the format expected by the third-party. Advantageously, the system may then also convert the individual responses received from each API, which may again be in a third-party-specific format, into a common format that may facilitate comparison by the user. Similarly, various embodiments may use external APIs to access other services.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The term "substantially" when used in conjunction with the term "real-time" forms a phrase that will be readily understood by a person of ordinary skill in the art. For example, it is readily understood that such language will include speeds in which no or little delay or waiting is discernible, or where such delay is sufficiently short so as not to be disruptive, irritating, or otherwise vexing to a user.

Conjunctive language such as the phrase "at least one of X, Y, and Z," or "at least one of X, Y, or Z," unless specifically stated otherwise, is to be understood with the context as used in general to convey that an item, term, etc. may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general purpose computer comprising one or more processors should not be interpreted as excluding other computer components, and may possibly include such components as memory, input/output devices, and/or network interfaces, among others.

Spatially relative terms, such as "forward", "rearward", "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features due to the inverted state. Thus, the term "under" may encompass both an orientation of over and under, depending on the point of reference or orientation. The device may be otherwise oriented (rotated 90 degrees or at other orientations) and the spatially relative descriptors used herein interpreted accordingly. Similarly, the terms "upwardly", "downwardly", "vertical", "horizontal" and the like may be used herein for the purpose of explanation only unless specifically indicated otherwise.

Although the terms "first" and "second" may be used herein to describe various features/elements (including steps or processes), these features/elements should not be limited by these terms as an indication of the order of the features/elements or whether one is primary or more important than the other, unless the context indicates otherwise. These terms may be used to distinguish one feature/element from another feature/element. Thus, a first feature/element discussed could be termed a second feature/element, and similarly, a second feature/element discussed below could be termed a first feature/element without departing from the teachings provided herein.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise.

For example, if the value "10" is disclosed, then "about 10" is also disclosed. Any numerical range recited herein is intended to include all sub-ranges subsumed therein. It is also understood that when a value is disclosed that "less than or equal to" the value, "greater than or equal to the value" and possible ranges between values are also disclosed, as appropriately understood by the skilled artisan. For example, if the value "X" is disclosed the "less than or equal to X" as well as "greater than or equal to X" (e.g., where X is a numerical value) is also disclosed. It is also understood that the throughout the application, data is provided in a number of different formats, and that this data, may represent endpoints or starting points, and ranges for any combination of the data points. For example, if a particular data point "10" and a particular data point "15" may be disclosed, it is understood that greater than, greater than or equal to, less than, less than or equal to, and equal to 10 and 15 may be considered disclosed as well as between 10 and 15. It is also understood that each unit between two particular units may be also disclosed. For example, if 10 and 15 may be disclosed, then 11, 12, 13, and 14 may be also disclosed.

Although various illustrative embodiments have been disclosed, any of a number of changes may be made to various embodiments without departing from the teachings herein. For example, the order in which various described method steps are performed may be changed or reconfigured in different or alternative embodiments, and in other embodiments one or more method steps may be skipped altogether. Optional or desirable features of various device and system embodiments may be included in some embodiments and not in others. Therefore, the foregoing description is provided primarily for the purpose of example and should not be interpreted to limit the scope of the claims and specific embodiments or particular details or features disclosed.

While the above detailed description has shown, described, and pointed out novel features as applied to various embodiments, it may be understood that various omissions, substitutions, and changes in the form and details of the devices or processes illustrated may be made without departing from the spirit of the disclosure. As may be recognized, certain embodiments of the inventions described herein may be embodied within a form that does not provide all of the features and benefits set forth herein, as some features may be used or practiced separately from others. The scope of certain inventions disclosed herein is indicated by the appended claims rather than by the foregoing description. All changes which come within the meaning and range of equivalency of the claims are to be embraced within their scope.

What is claimed is:

1. A computer-implemented method for visualizing and interacting with a plurality of models depicted in a graphical user interface, the computer-implemented method comprising:
    obtaining the plurality of models, wherein the plurality of models comprises a first model and a second model;
    obtaining first time-series data corresponding to the first model and second time-series data corresponding to the second model;
    simulating the first and second models using at least a portion of the first time-series data or the second time-series data; and
    generating user interface data that, when rendered by a user device, causes the user device to display a graphical user interface comprising a first panel and a time-series line graph, wherein the first panel depicts a result of the simulation of the first and second models, wherein the time-series line graph comprises a time slider and a time-series line associated with an object property of an object of the first model, and wherein a color or shading of at least a portion of the time-series line or the time slider changes based on the status of the object property of the object of the first model,
    wherein the method is performed using one or more processors.

2. The computer-implemented method of claim 1, wherein the graphical user interface further comprises a second panel depicting a plurality of objects corresponding to the first model.

3. The computer-implemented method of claim 2, wherein the plurality of objects comprises a first object, and wherein the first object is depicted in the second panel in association with a first color to indicate a state of the first object.

4. The computer-implemented method of claim 2, wherein the plurality of objects comprises a first object, and wherein a width of a line coupled to the first object in the second panel represents a value of an object property of the first object.

5. The computer-implemented method of claim 2, wherein the plurality of objects comprises a first object, and wherein the second panel further depicts an indication of an event associated with the first object.

6. The computer-implemented method of claim 5, wherein the event comprises one of a weather event, deferral event, or a maintenance event.

7. The computer-implemented method of claim 2, wherein the second panel depicts a schematic of the plurality of objects.

8. The computer-implemented method of claim 1, wherein the graphical user interface further comprises a second panel depicting one or more subsystems corresponding to the first model.

9. The computer-implemented method of claim 8, wherein the second panel depicts a schematic of the one or more subsystems.

10. The computer-implemented method of claim 9, wherein the one or more subsystems comprises a plurality of objects corresponding to the first model.

11. The computer-implemented method of claim 1, wherein the first panel further depicts a second result of a second simulation of the first and second models.

12. The computer-implemented method of claim 11, wherein the first panel depicts the result and the second result as a time-series graph.

13. The computer-implemented method of claim 12, wherein the graphical user interface further comprises a second panel depicting a first object corresponding to the first model and an indication of an event associated with the first object, and wherein one or more portions of the time-series graph changes color based on the indication of the event.

14. The computer-implemented method of claim 12, wherein one or more portions of a time-series data line of the time-series graph changes color based on a status of an object property of an object of the first model.

15. The computer-implemented method of claim 1, wherein the first model is one of a known or black box system.

16. The computer-implemented method of claim 1, further comprising receiving an indication of a request to note or markup the graphical user interface with one or more annotations.

17. A system for visualizing and interacting with a plurality of models depicted in a graphical user interface, the system comprising:
    one or more non-transitory computer readable storage mediums storing program instructions; and
    one or more processors configured to execute the program instructions, wherein the program instructions, when executed by the one or more processors, cause the system to:
        obtain the plurality of models, wherein the plurality of models comprises a first model and a second model;
        obtain first time-series data corresponding to the first model and second time-series data corresponding to the second model;
        simulate the first and second models using at least a portion of the first time-series data or the second time-series data; and
        generate user interface data that, when rendered by a user device, causes the user device to display a graphical user interface comprising a first panel and a time-series line graph, wherein the first panel depicts a result of the simulation of the first and second models, wherein the time-series line graph comprises a time slider and a time-series line associated with an object property of an object of the first model, and wherein a color or shading of at least a portion of the time-series line or the time slider changes based on the status of the object property of the object of the first model.

* * * * *